US008525045B2

(12) United States Patent
Yamaguchi et al.

(10) Patent No.: US 8,525,045 B2
(45) Date of Patent: Sep. 3, 2013

(54) FARADAY CAGE AND DEVICE HAVING SAME

(75) Inventors: Chiseki Yamaguchi, Yamatokoriyama (JP); Naoya Hamada, Yamatokoriyama (JP); Shunsuke Umezawa, Yamatokoriyama (JP); Takuo Wariishi, Yamatokoriyama (JP); Tomohiro Kamitani, Yamatokoriyama (JP); Naoki Moribe, Yamatokoriyama (JP)

(73) Assignee: U-TEC Corporation, Nara (JP)

( * ) Notice: Subject to any disclaimer, the term of this patent is extended or adjusted under 35 U.S.C. 154(b) by 228 days.

(21) Appl. No.: 13/001,131

(22) PCT Filed: Jun. 24, 2009

(86) PCT No.: PCT/JP2009/061514

§ 371 (c)(1), (2), (4) Date: Dec. 23, 2010

(87) PCT Pub. No.: WO2009/157483

PCT Pub. Date: Dec. 30, 2009

(65) Prior Publication Data

US 2011/0100701 A1 May 5, 2011

(30) Foreign Application Priority Data

| | | |
|---|---|---|
| Jun. 26, 2008 | (JP) | 2008-167129 |
| Jul. 16, 2008 | (JP) | 2008-184562 |
| Oct. 10, 2008 | (JP) | 2008-263542 |
| Feb. 25, 2009 | (JP) | 2009-042969 |
| Mar. 10, 2009 | (JP) | 2009-056179 |

(51) Int. Cl.
*H05K 9/00* (2006.01)

(52) U.S. Cl.
USPC ............... 174/382; 174/386; 399/21; 399/61; 430/108.6

(58) Field of Classification Search
USPC ............ 174/386, 382
See application file for complete search history.

(56) References Cited

U.S. PATENT DOCUMENTS 3,681,899 A * 8/1972 Grote ............ 96/147
5,521,690 A * 5/1996 Taffler et al. ............ 399/93

(Continued)

FOREIGN PATENT DOCUMENTS

JP 62-059665 U 4/1987
JP 4-009078 A 1/1992

(Continued)

OTHER PUBLICATIONS

English Patent Abstract of JP 4009078 from esp@cenet, Publication Date: Jan. 13, 1992 (1 Page).

(Continued)

*Primary Examiner* — William H Mayo, III
*Assistant Examiner* — Hiram E Gonzalez
(74) *Attorney, Agent, or Firm* — Osha Liang LLP

(57) ABSTRACT

A Faraday cage includes a casing structured by a first housing having a first outer cover made of a conductive material, and a first inner cover made of a conductive material, which is accommodated in the first outer cover and is electrically insulated from the first outer cover, and a second housing having a second outer cover made of a conductive material, which fits the first outer cover, and a second inner cover made of a conductive material, which is accommodated in the second outer cover and is electrically insulated from the second outer cover, the first and second housings being separable from each other; and a filter cartridge disposed inside the casing configured to be separable into two pieces, which accommodates therein a first filter for collecting fine particles sucked in from the outside the casing.

28 Claims, 14 Drawing Sheets

(56) References Cited

U.S. PATENT DOCUMENTS

| | | | | |
|---|---|---|---|---|
| 2005/0056441 | A1* | 3/2005 | Rider et al. | 174/35 R |
| 2007/0071472 | A1* | 3/2007 | Kubo et al. | 399/51 |

FOREIGN PATENT DOCUMENTS

| | | | |
|---|---|---|---|
| JP | 4-015676 | A | 1/1992 |
| JP | 4-328592 | A | 11/1992 |
| JP | 5-011511 | A | 1/1993 |
| JP | 6-063116 | U | 9/1994 |
| JP | 6-071164 | U | 10/1994 |
| JP | 11-101834 | A | 4/1999 |
| JP | 2000-117089 | A | 4/2000 |
| JP | 3567463 | B2 | 6/2004 |
| JP | 2006-161873 | A | 6/2006 |
| JP | 2008-145013 | A | 6/2008 |
| WO | 97/36174 | A1 | 10/1997 |

OTHER PUBLICATIONS

English Patent Abstract of JP 2008-145013 from esp@cenet, Publication Date: Jun. 26, 2008 (1 Page).

English Patent Abstract of JP 2006-161873 from esp@cenet, Publication Date: Jun. 22, 2006 (1 Page).

Office Action in Japanese Patent Application No. 2008-184562, mailing date Jul. 17, 2012, and English translation thereof (9 pages).

English translations of International Preliminary Report on Patentability and Written Opinion of The International Searching Authority issued in International Application No. PCT/JP2009/061514 mailed on Feb. 17, 2011, 5 pages.

International Search Report issued in PCT/JP2009/061514, mailed on Sep. 8, 2009, with translation, 4 pages.

Notice of Reasons for Rejection issued in Japanese Application No. 2009-042969, mailed on Mar. 12, 2013 and translation thereof (7 pages).

* cited by examiner (a)

(b)

FARADAY CAGE AND DEVICE HAVING SAME

CROSS-REFERENCE TO RELATED APPLICATIONS

The present application is a national stage application under 35 U.S.C. §371 of PCT Application No. PCT/JP2009/061514, filed on Jun. 24, 2009, which claims priority from Japanese Patent Application No. 2008-167129 filed on Jun. 26, 2008, Japanese Patent Application No. 2008-184562 filed on Jul. 16, 2008, Japanese Patent Application No. 2008-263542 filed on Oct. 10, 2008, Japanese Patent Application No. 2009-042969 filed on Feb. 25, 2009, and Japanese Patent Application No. 2009-056179 filed on Mar. 10, 2009, the contents of which are incorporated herein by reference.

TECHNICAL FIELD

The present invention relates to a Faraday cage and a device having the same, each of which is for sucking in a measurement sample which is charged fine particles such as a toner for use in an electrophotographic technology and a charged powder coating or the like for the electrostatic powder coating technology, and measuring an electric charge of the measurement sample.

BACKGROUND ART

As an example of a known Faraday cage, Patent Document 1 describes a Faraday cage including an insulated container, and a suction nozzle (conductive container) disposed inside the insulation container, which has an intake vent part and an exhaust vent part sandwiching therebetween a filter for collecting toner, whereby the electric charge of the toner inside the suction nozzle serving as a conductive container is measured. In such a Faraday cage is measured the electric charge of the toner sucked into the suction nozzle in the insulation container. The lid of the insulation container is removed to take out the suction nozzle from the insulation container, and the weight of the suction nozzle containing the toner is measured. The per-unit weight electrostatic charge of the toner is then calculated by dividing the measured electric charge by the difference between the weight of the suction nozzle alone, which is measured beforehand, and the measured weight of the suction nozzle containing the toner.

PRIOR ART DOCUMENT

Patent Document

[Patent Document 1] Publication of Japanese Patent No. 3567463 (FIG. 5)

DISCLOSURE OF THE INVENTION

The Faraday cage described in Patent Document 1 necessitates removal of the lid of the insulation container, when measuring the weight of the suction nozzle. Patent Document 1 however is silent as to the specific structure of attaching the lid to the insulation container. If the lid is firmly fixed to the insulation container by using a plurality of screws, troublesome work is required every time the suction nozzle is taken out from or placed in the insulation container. Further, if there is another measurement, the suction nozzle has to be dismembered for cleaning up the toner adhered to the suction nozzle.

This further necessitates work such as replacement of the filter in the suction nozzle, which consequently leads to a problem such as one that too much time is taken for preparing for the measurement.

In view of the above described problems, it is an object of the present invention to provide a Faraday cage and a device having the same, in which a conductive container detachably accommodates a filter cartridge and enables the filter cartridge to be easily placed in or taken out from the conductive container, thereby simplifying preparation work for a measurement after another.

A Faraday cage of the present invention includes: a casing structured by a first housing having a first outer cover made of a conductive material, and a first inner cover made of a conductive material, which is accommodated in the first outer cover and is electrically insulated from the first outer cover, and a second housing having a second outer cover made of a conductive material, which fits the first outer cover, and a second inner cover made of a conductive material, which is accommodated in the second outer cover and is electrically insulated from the second outer cover, the first and second housings being separable from each other; and a filter cartridge disposed inside the casing configured to be separable into two pieces, which accommodates therein a first filter for collecting fine particles sucked in from the outside the casing.

With the casing structured to be separable into two pieces, the filter cartridge is easily placed in or taken out from the casing. Further, preparation for the subsequent measurement only requires replacement of the filter cartridge with a new one. There is no longer a need for disassembling the suction nozzle or the like and clean the same. Therefore, the workability of the measurement is improved.

Further, a Faraday cage of the present invention includes: a casing structured by a first housing having a first outer cover made of a conductive material, and a first inner cover made of a conductive material, which is accommodated in the first outer cover and is electrically insulated from the first outer cover, and a second housing having a second outer cover made of a conductive material, which fits the first outer cover, and a second inner cover made of a conductive material, which is accommodated in the second outer cover and is electrically insulated from the second outer cover; and a filter cartridge disposed inside the casing, which accommodates therein a first filter for collecting fine particles sucked in from the outside the casing. The first and second housings have a lock mechanism which, by fitting the first and second outer covers together, enables the both housings to be engaged with each other, while keeping the respective end surfaces of the first and second inner covers pressed against each other relative to a fitting direction.

With this, simply fitting the first and second outer covers together causes the lock mechanism to work, and the both housings are engaged with each other, with the filter cartridge mounted therein. With the lock mechanism for engaging the both housings with each other, the filter cartridge is easily placed in or taken out from the casing separable into two pieces. Further, preparation for the subsequent measurement only requires replacement of the filter cartridge with a new one. There is no longer a need for disassembling the suction nozzle or the like and clean the same. Therefore, the workability of the measurement is improved. Further, when the both housings are engaged with each other, the electric contact between the first and second outer covers and the electric contact between the first and second inner covers are firmly maintained. It is therefore possible to accurately measure the electric charge in the space closed by the first and second inner covers. At the same time, with the electrically contacted first and second outer covers, the influence of an external electric field is effectively eliminated, when measuring the electric charge in the space closed by the first and second inner covers.

In the present invention, the lock mechanism includes a projection projecting in the fitting direction, from a portion of an inner circumferential surface of one of the first and second outer covers facing another one of the first and second outer covers, and an annular projection projecting from a portion of an outer circumferential surface of the other one of the first and second outer covers facing the one of the first and second outer covers, the annular projection having a notch which corresponds to the projection. It is preferable that the projection engage with the annular projection by rotating one of the housings less than once in a circumferential direction, after the first and second outer covers are fit together in such a manner that the projection passes the notch. This way, the lock mechanism is made simple.

In the present invention, it is preferable to provide a first biasing member disposed between the first outer cover and the first inner cover, which biases the first inner cover away from the first outer cover along the fitting direction. This increases the pressure for pressing the end surface of the second inner cover against the end surface of the first inner cover when the both housings are engaged with each other. Therefore, the further reliable electric contact between these members is maintained.

In the present invention, it is preferable to provide a second biasing member disposed between the first inner cover and the filter cartridge, which biases the filter cartridge away from the first inner cover in the fitting direction. With this, the second biasing member absorbs variation of a certain level in the size of the filter cartridge relative to the fitting direction.

Further, in the present invention, it is preferable that the first and second outer covers have a hard coating on their respective fitting areas; and that the hard coating be harder than a base material of the covers. Since the hard coatings are formed on the fitting areas of the first and second outer covers, respectively, it is possible to restrain the chipping off, galling, or the like, which is attributed to the friction of the first and second outer covers in the fitting area at the time of coupling the first and second outer covers. The first and second outer covers can be repetitively coupled with or separated from each other.

Further, in the present invention, it is preferable that the hard coating be insulative; and that the hard coating be not formed on respective contact areas of the first and second outer covers, the contact areas being respective portions of the fitting areas, which contact each other when the first and second outer covers are coupled with each other. With the structure, even if the hard coating is insulative, the first and second outer covers are electrically connectable to each other, when the first and second outer covers are coupled with each other. Thus, with the first and second outer covers, the influence of an external electric field is effectively eliminated, when measuring the electric charge in the space closed by the first and second inner covers.

Further, in the present invention, it is preferable that the hard coating be formed on the entire surfaces of the first and second outer covers, except for the contact areas. Since the first and second outer covers are coated by the hard coating, continuity is prevented between the first outer cover and the first inner cover, and between the second outer cover and the second inner cover, even a conductive foreign matter or a water droplet enters between the first outer cover and the first inner cover, or between the second outer cover and the second inner cover. Therefore, the electric charge in the first and second inner covers is accurately measured.

Further, in the present invention, it is preferable that the first and second outer covers be made of aluminum or an alloy containing aluminum; and that the hard coating be formed by anodizing. With this, the respective weights of the first and second outer covers are made relatively light, and therefore the entire weight of the Faraday cage is reduced.

Further, in the present invention, it is preferable that the hard coating be conductive. Thus, when the first and second outer covers are coupled with each other, the first and second outer covers are electrically connectable. Thus, with the first and second outer covers, the influence of an external electric field is effectively eliminated, when measuring the electric charge in the space closed by the first and second inner covers.

Further, in the present invention, the filter cartridge is made of a synthetic resin, and includes a first cylindrical part extended in a direction of sucking in fine particles, an increased-diameter part accommodating therein the first filter, whose diameter is larger than that of the first cylindrical part, and a second cylindrical part extended in the suction direction, which is disposed in such a manner that the increased-diameter part is interposed between the second cylindrical part and the first cylindrical part in the suction direction. It is further preferable that a light-transmissive area be formed at least one of the first cylindrical part, the increased-diameter part, and the second cylindrical part. With this, it is possible to easily confirm, through the light-transmissive area, whether the filter cartridge is a new one or one which is already used and have collected the fine particles. This prevents inadvertent usage of an already-used filter cartridge.

Further, in the present invention, it is preferable that the light-transmissive area be formed upstream of the first filter of the increased-diameter part, relative to the suction direction. This structure enables confirmation of the fine particles collected by the first filter through the light-transmissive area. Therefore, it is possible to reliably prevent a usage of an already-used filter cartridge.

Further, in the present invention, it is preferable that the filter cartridge be made of a transparent or semi-transparent synthetic resin, and that the light-transmissive area be formed on the entire filter cartridge. With this, whether or not the filter cartridge is used one is easily confirmed. Further, it is also possible to confirm the status of the first filter accommodated in the filter cartridge, if the filter cartridge is transparent.

Further, in the present invention, the first cylindrical part is disposed upstream of the increased-diameter part relative to the suction direction, and has a length which is longer than the diameter of the increased-diameter part and longer than the second cylindrical part. It is preferable that the first cylindrical part have a degression area in which the inner diameter of the first cylindrical part gradually decreases in the suction direction, and a progressive area formed at the downstream of the degression area, in which the inner diameter gradually increases in the suction direction. This structure enables an easier operation of sucking in the charged fine particles from the outside, and separate dies can be adopted for manufacturing the lengthy first cylindrical part. This contributes to reduction of the manufacturing cost of the filter cartridge.

Further, in the present invention, it is preferable that the second cylindrical part have a progressive area in which the inner diameter of the second cylindrical part gradually increases in the suction direction; and that an outlet port at the most downstream of the second cylindrical part have a larger diameter than that of a suction port at the most upstream of the first cylindrical part. This strengthens the suction force from the suction port.

Further, in the present invention, it is preferable that the second cylindrical part have, at its downstream end portion relative to the suction direction, an annular projection projecting from the outer circumferential surface of the second cylindrical part. This makes it easier to hold the filter cartridge when the filter cartridge is placed in or taken out from the casing.

Further, in the present invention, it is preferable that an outer circumferential side surface of the increased-diameter part be chamfered to form a polygonal shape. This way, the filter cartridge removed from the casing is restrained from rolling. Therefore, the fine particles are less likely spilled from the filter cartridge, and the weight of the filter cartridge having collected the fine particles is stably measured.

Further, in the present invention, the filter cartridge includes a container made of a synthetic resin. It is preferable that the container be made conductive. In the structure, the container is made conductive. Therefore, it is possible to highly accurately measure the weight of the filter cartridge including the container, by using a weight gauge. With the conductive filter cartridge, equal quantities of opposite charges occur in the container due to electrostatic induction caused by the charge of the fine particles collected by the first filter, the charge on the interior surface of the container and the charge occurred on the fine particles which are caused by triboelectric charging when the fine particles are being sucked in, respectively. The charges caused by the electrostatic induction closes the electric lines of forces from the charge of the fine particles, the charge on the interior surface of the filter cartridge and the charge occurred on the fine particles which are caused by triboelectric charging when the fine particles are being sucked in, respectively. Thus, when measuring the weight, the influence of the charges to the outside of the container is restrained or prevented.

Further, in the present invention, it is preferable that the synthetic resin contains a conductive material. This enables highly accurate measurement of the filter cartridge by using a weight gauge.

Further, in the present invention, it is preferable that the container have a conductive film which is formed on at least a part of its exterior surface. This enables highly accurate measurement of the filter cartridge which is the container by using a weight gauge. This is because, for a charge in the filter cartridge, an equal quantity of opposite charge occurs on the conductive film, due to electrostatic induction, and it is possible to restrain or prevent the influence of these charges to the outside of the container.

Further, in the present invention, it is preferable that the container have a conductive film throughout its entire exterior surface. This enables highly accurate measurement of the filter cartridge by using a weight gauge.

Further, in the present invention, the outer circumferential surface of the filter cartridge has thereon a plurality of projections which are disposed apart from one another along the circumferential direction. It is preferable that the plurality of projections each have a leading end which engages with the first inner cover, when the filter cartridge is inserted into the first inner cover. This prevents the filter cartridge from falling off from the casing, when the filter cartridge is taken out from the casing. Thus, the fine particles are less likely spilled from the filter cartridge.

Further, in the present invention, it is preferable that the upstream end of the first inner cover and the upstream end of the filter cartridge be disposed at substantially the same position relative to the suction direction of sucking in fine particles. This way, all the fine particles sucked into the first and second inner covers are entirely collected in the filter cartridge.

Further, in the present invention, it is preferable to further provide a filter unit which is provided in a midway portion of a route downstream from the filter cartridge, and which includes a second filter whose filtration accuracy is equal to or higher than that of the first filter. In the above structure, the filter unit is provided in the midway portion of the route. Thus, even when the first filter is damaged, or when the first filter is not in the filter cartridge, the fine particles sucked in with the air is collected by the filter unit. It is therefore possible to reliably prevent the risk of scattering to the outside the fine particles having been sucked in.

Further, in the present invention, it is preferable that the filter unit be provided outside the casing. This enables downsizing of the casing. Further, whether or not the filter unit is provided is confirmed at one glance.

Further, in the present invention, the filter unit has a resin case for accommodating the second filter. It is preferable that the resin case have a light-transmissive area in its portion to face the second filter. With the structure, it is possible to know at one glance whether or not the filter unit has collected the fine particles which are essentially supposed to be collected by the first filter. This way, a damage to the first filter or an absence of the first filter is surely confirmed.

Further, in the present invention, it is preferable that the filtration accuracy of the second filter be higher than that of the first filter. Thus, it is possible to reliably collect fine particles having passed the filter cartridge, which have a particle diameter too small for the filtration accuracy of the first filter.

A device of the present invention includes: a Faraday cage; an electric potential meter connected to wiring which is connected to one of the first and second outer covers and one of the first and second inner covers; and a weight gauge capable of measuring the weight of the filter cartridge. The Faraday cage includes: a casing structured by a first housing having a first outer cover made of a conductive material, and a first inner cover made of a conductive material, which is accommodated in the first outer cover and is electrically insulated from the first outer cover, and a second housing having a second outer cover made of a conductive material, which fits the first outer cover, and a second inner cover made of a conductive material, which is accommodated in the second outer cover and is electrically insulated from the second outer cover, the first and second housings being separable from each other; and a filter cartridge disposed inside the casing configured to be separable into two pieces, which accommodates therein a first filter for collecting fine particles sucked in from the outside the casing.

With this, efficient measurement of the electric charge and the weight of the fine particles is possible, by measuring the electric charge of the fine particles sucked into the filter cartridge, and measuring the weight of the fine particles in the filter cartridge thereafter. After the measurement of the electric charge, the fine particles are easily and reliably removed from the casing simply by taking out the filter cartridge from the casing.

BEST MODE FOR CARRYING OUT THE INVENTION

The following describes a preferable embodiment of the present invention, with reference to the attached documents.

Figure 1:
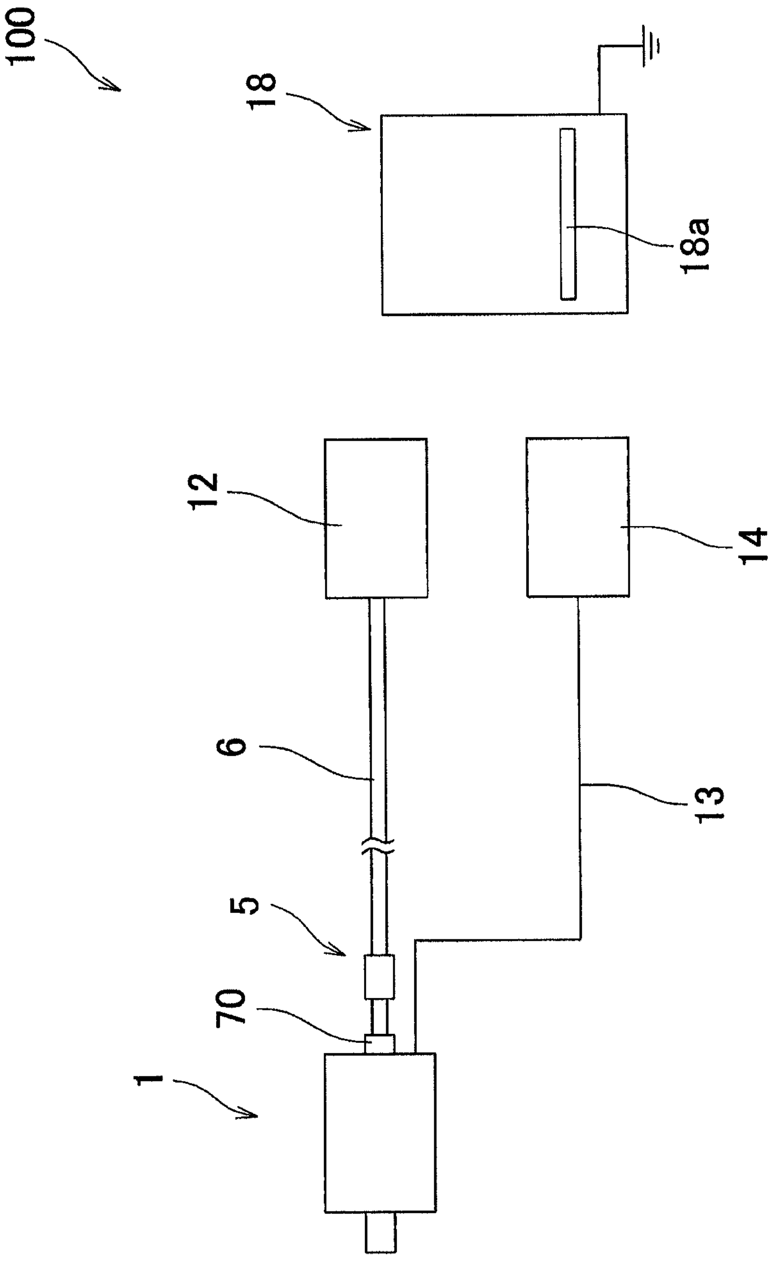
FIG. 1 shows a schematic diagram of a device of an embodiment, according to the present invention.

As shown in FIG. 1, a device 100 includes: a Faraday cage 1 which is for measuring an electric charge of fine particles sucked in from the outside; a piping members 6 connected to the Faraday cage 1 through a connection member 70; a filter unit 5 provided between the piping members 6; a suction pump 12 connected to the Faraday cage 1 through the piping members 6; an electric potential meter 14 connected to the coaxial cable 13 which is connected to the Faraday cage 1; and a weight gauge 18. Note that a known electric potential meter and a known weight gauge are adopted as the electric potential meter 14 and the weight gauge 18 (an electronic balance 18 in the present embodiment), respectively. The suction pump 12 and the electric potential meter 14 may be integrally structured. Further, as the piping members 6, a flexible tube made of rubber or a synthetic resin is used.

Figure 2:
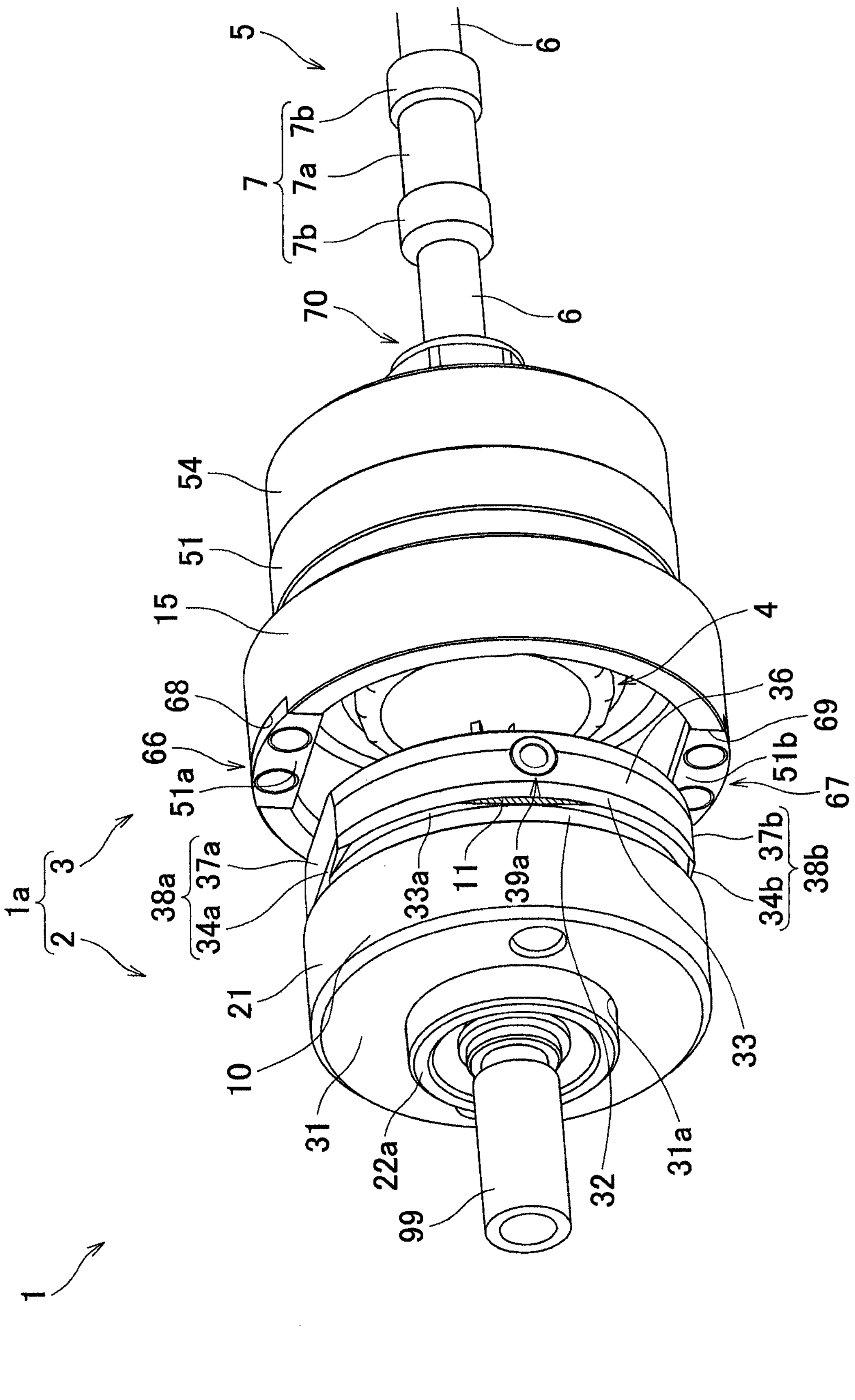
FIG. 2 is a perspective diagram showing first and second housings of a Faraday cage of the embodiment, according to the present invention, the first and second housings being separated from each other.

As shown in FIG. 2, the Faraday cage 1 has a casing 1*a* having substantially a cylindrical outline, and a filter cartridge 4 accommodated in the casing 1*a*. The casing 1*a* has a first housing 2 and a second housing 3 which are separable from each other. Note that the filter cartridge 4 is disposed between the both housings 2 and 3. Since the casing 1*a* is separable into two pieces, the filter cartridge 4 is easily placed in or taken out from the casing 1*a*. Further, the casing 1*a* is provided with the connection member 70 for connecting one of the piping members 6 to the casing 1*a*. Thus, driving of the suction pump 12 enables the Faraday cage 1 to suck in fine particles along with the air from the outside in a direction parallel to the axis of the Faraday cage 1, from the left to right of FIG. 4 (hereinafter, suction direction A). This suction causes the air, which is to be output from the casing 1*a* (the air sucked into the casing 1*a* from the outside), to flow from a hole 70*a* of the connection member 70 towards the suction pump, through the piping members 6 and the filter unit 5. That is, the connection member 70, the piping members 6, and the filter unit 5 provided between the piping members 6 structure an air outputting route.

Figure 3:
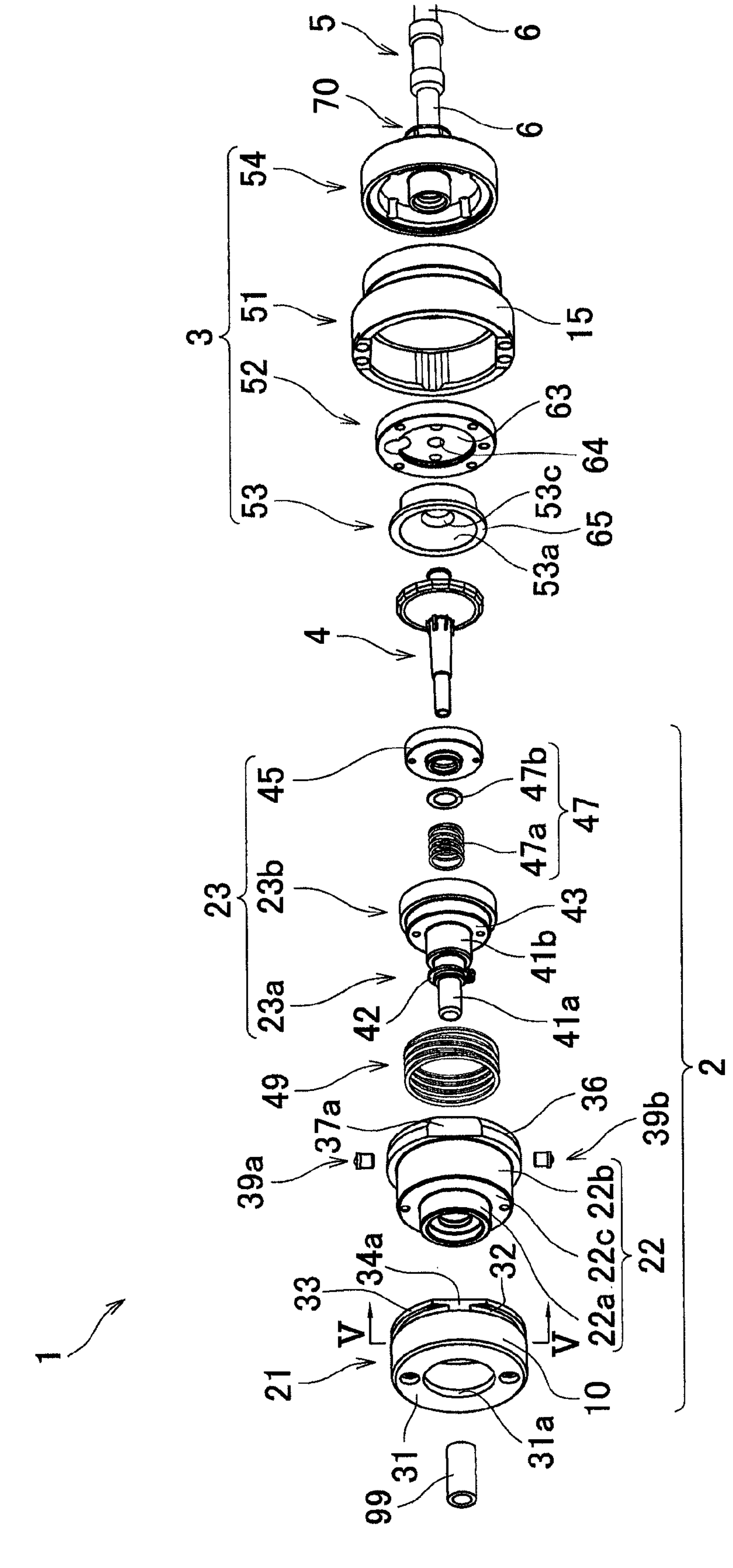
FIG. 3 is an exploded perspective diagram of the Faraday cage shown in FIG. 1.
Figure 4:
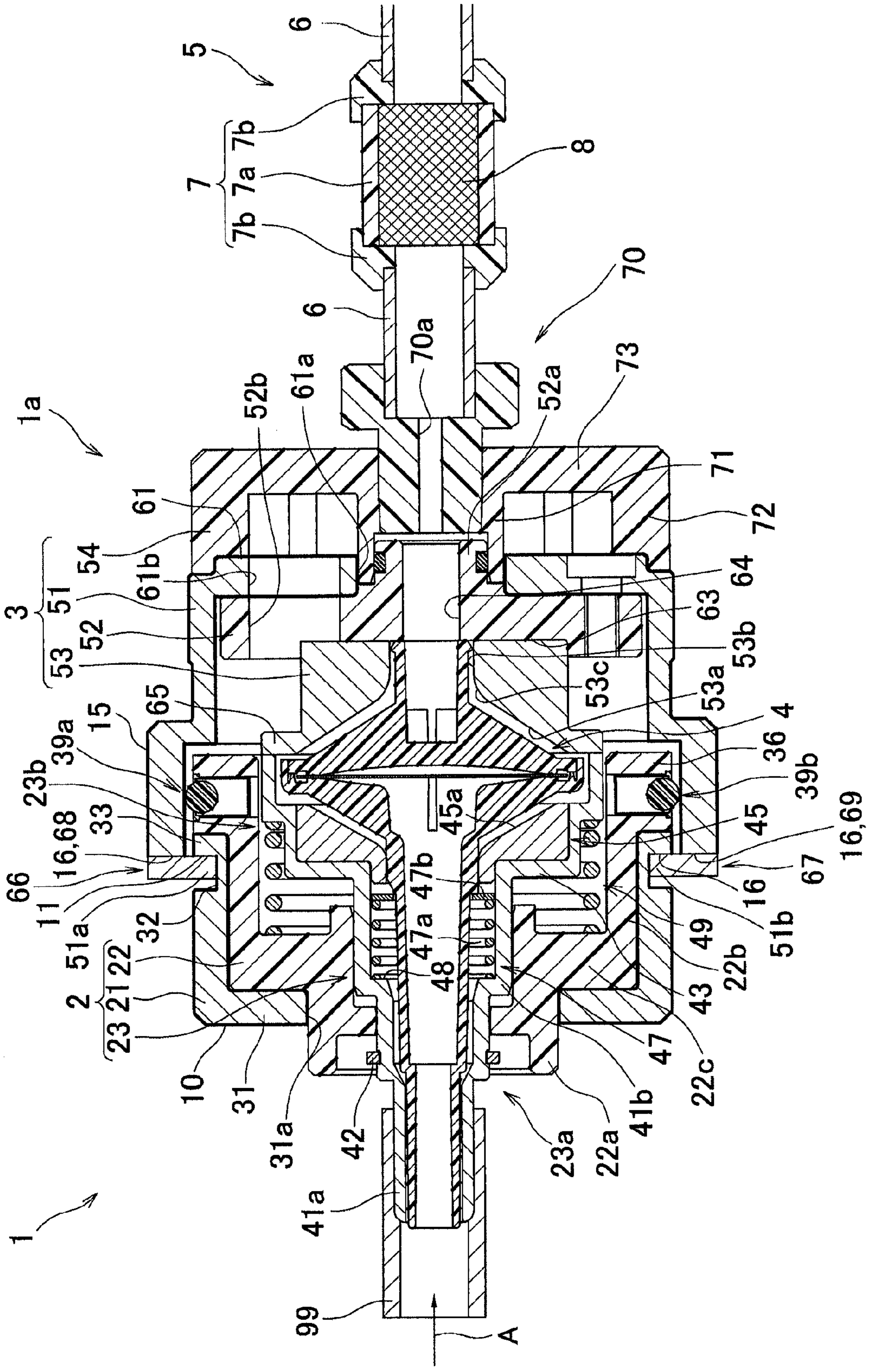
FIG. 4 is a cross sectional view showing the Faraday cage of the embodiment, according to the present invention.

As shown in FIG. 3 and FIG. 4, the first housing 2 has: a cylindrical first outer cover 21 made of an aluminum alloy; a cylindrical first holder 22 made of polycarbonate resin; and a cylindrical first inner cover 23 made of stainless steel. The first inner cover 23 is disposed so as to sandwich the first holder 22 between the first inner cover 23 and the first outer cover 21. The first outer cover 21 and the first inner cover 23 are electrically insulated from each other. Note that the first outer cover 21 may be structured by a conductive material such as aluminum, copper, and a magnesium alloy. Further, the first inner cover 23 may be structured by a conductive material other than stainless steel. The first holder 22 may be structured by an insulative material other than polycarbonate resin.

At the upstream end of the first outer cover 21 relative to the suction direction A is an annular flange 31. The annular flange 31 has a hole 31*a* through which the first holder 22 and the first inner cover 23 are partially in communication. At the downstream end of the first outer cover 21 relative to the suction direction A is an annular projection 33 which is structured by forming a groove 32 extending in the circumferential direction nearby that downstream end. The annular projection 33 has two notches 34*a* and 34*b*. These two notches 34*a* and 34*b* are point-symmetrical with respect to the center axis of the first outer cover 21. That is, the notch 34*a* is formed in a position 180° displaced from the notch 34*b*. Note that, as shown in FIG. 4, the annular projection 33 project from the outer circumferential surface which, when the first outer cover 21 and the second outer cover 51 of the second housing 3 are fit together, overlaps the second outer cover 51 of the first outer cover 21 relative to the fitting direction.

On the entire surface of the first outer cover 21 is an anode oxide layer, i.e., an insulative hard coating 10, which is formed by anodizing and which is harder than the aluminum alloy used as the base material of the first outer cover 21. In the present embodiment, anodizing is adopted as the surface treatment, and the thickness of the hard coating 10 is approximately 30 μm. The thickness of the hard coating 10 however may be any thickness within a range from 10 μm, inclusive, and 100 μm, inclusive. In other words, the entire surface of the first outer cover 21 is made harder than the base material with the hard coating 10 of 10 μm or more in thickness, and the hard coating 10 can be formed as long as the thickness thereof is 100 μm or less.

Further, a surface treatment other than anodizing is adoptable as long as a hard coating harder thane the base material of the first outer cover 21 is formed on the entire surface of the first outer cover 21. Examples of adoptable surface treatment include various platings such as hard chromium plating, electroless nickel plating; a conversion treatment, an LD (antirust black conductive thin coating) treatment; or any combination of these treatments. Note that the hard coating, which is formed by any of the various plating treatments such as hard chromium plating, electroless nickel plating, or the like, a conversion treatment, LD treatment, or any combination of these surface treatments, is conductive. The other possible treatments may be application of a material that forms the hard coating onto the surface of the first outer cover 21, or dipping the surface into such a material, and then subjecting the material to a curing treatment thereafter. Further, ion plating, a laser irradiation, or quenching are also adoptable. The coating film described in the present invention encompasses a film or layer formed over the base material surface or a film or a layer formed within the surface of the base material, which has a property (curing property or the like) that is different from the base material.

Figure 5:
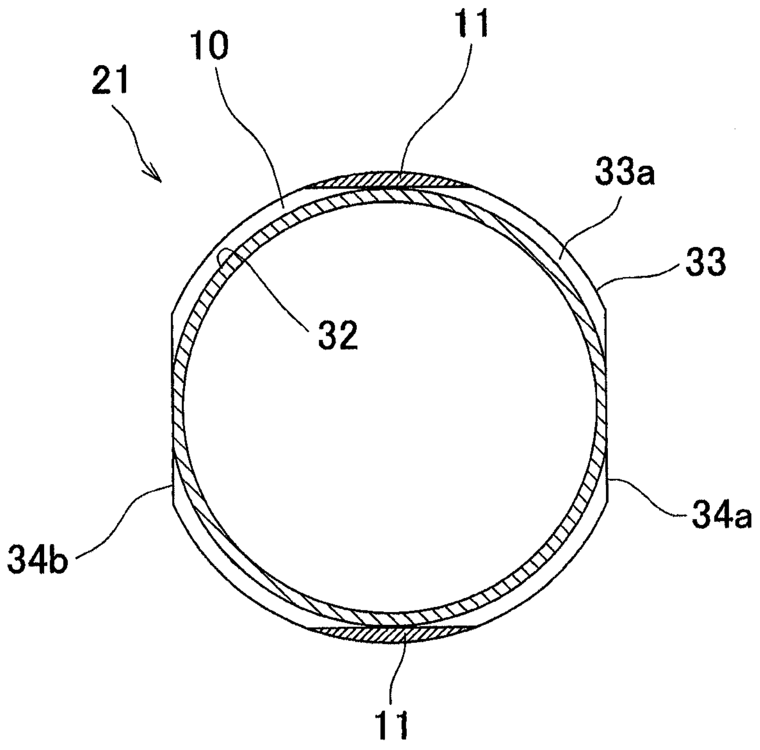
FIG. 5 is a cross sectional view taken along the line V-V in FIG. 3.

As shown in FIG. 5, there are two contact areas 11 where no hard coating 10 is formed, on a surface 33*a* of the annular projection 33 of the first outer cover 21 facing the groove 32. These two contact areas 11 are point-symmetrical to each other about the center axis of the first outer cover 21. Note that each of the two contact areas 11 is in a position 90° displaced from the notches 34*a* and 34*b*. Further, the two contact areas 11 are formed in an fitting area (areas where two surfaces overlap each other in the fitting direction) where the first outer cover 21 and the later described second outer cover 51 are fit together, and are positioned such that the two contact areas 11 contact later-described projection forming members 66 and 67 respectively, when the both housings 2 and 3 are coupled with each other.

The contact areas 11 of the present embodiment are formed by forming the hard coating 10 on the entire surface of the first outer cover 21 except for the portions corresponding to the contact areas 11. Specifically, anodizing is conducted while masking the portions to become the contact areas 11 and then the masking is removed. That is, the contact areas 11 are the surface of the base material of the first outer cover 21, which is not anodized. Note that the contact areas 11 may be formed by: forming the hard coating 10 on the entire surface of the first outer cover 21, and then machining the hard coating 10 to expose, in the areas corresponding to the contact areas 11, the surface of the base material of the first outer cover 21 which is yet to be anodized. The present embodiment deals with a case where the hard coating 10 is formed on the entire surface of the first outer cover 21, except for the contact areas 11; however, the hard coating 10 may be formed only in the fitting areas except for the contact areas 11, or formed only on the groove 32 except for the contact areas 11. Further, the hard coating 10 may be formed only on the surface 33*a* except for the contact areas 11.

As shown in FIG. 3 and FIG. 4, the first holder 22 has: a cylindrical leading end portion 22*a* projecting outwardly from the hole 31*a*; a cylindrical main body part 22*b* which is mostly covered by the first outer cover 21; and an annular flange 22*c* connecting the leading end portion 22*a* and the main body part 22*b*. As shown in FIG. 4, the first holder 22 is structured by closely attaching and fixing the annular flange 22*c* to the annular flange 31 of the first outer cover 21 with screws from the outside the first outer cover 21.

At the downstream end of the main body part 22*b* relative to the suction direction A is formed an annular projection 36 which projects in radial directions of the main body part 22*b*. The annular projection 36 has an outer diameter which is substantially the same as the outer diameter of the annular projection 33. Further, on the annular projection 36 are formed two notches 37*a* and 37*b*. These notches 37*a* and 37*b* are disposed so that, when the first holder 22 is fixed to the first outer cover 21, the notch 37*a* faces the notch 34*a*, and the notch 37*b* faces the notch 34*b*. The notch 37*a* and the notch 34*a* form a single large notch 38*a*, and the notch 37*b* and the notch 34*b* form a single large notch 38*b*.

Further, annular projection 36 has two press-fit plungers 39*a* and 39*b* each of which has a resin ball outwardly biased in a radial direction of the main body part 22*b*. These two press-fit plungers 39*a* and 39*b* are point-symmetrical to each other about the center axis of the main body part 22*b*. That is, the press-fit plunger 39*a* is in a position 180° displaced from the press-fit plunger 39*b*. Note that the press-fit plungers 39*a* and 39*b* are in positions 90° displaced from the positions of the notches 37*a* and 37*b*.

As shown in FIG. 3 and FIG. 4, the first inner cover 23 has a lengthy part 23*a* extending along the suction direction A; an increased-diameter part 23*b* having a larger diameter than the inner diameter of the lengthy part 23*a* at the downstream end; and a cylindrical collar 45 disposed within the increased-diameter part 23*b*. The lengthy part 23*a* has a leading end portion 41*a* which projects from the first holder 22 when the first inner cover 23 is attached to the first holder 22; and a jointing portion 41*b* whose diameter is increased in steps along the suction direction A, which joints the leading end portion 41*a* and the increased-diameter part 23*b*. Note that when the first inner cover 23 is put through the first holder 22, the first inner cover 23 is prevented from detaching from the first holder 22 with a use of a C-shaped retaining ring 42. Note further that a short flexible tube 99 made of an insulative material is fit into the leading end portion 41*a*; however, this short flexible tube 99 is not particularly necessary.

The diameter of the increased-diameter part 23*b* is increased in steps along the suction direction A. On the inner circumferential surface of the collar 45 is formed a taper surface 45*a* which is tilted from the suction direction A. The collar 45 is fixed to the increased-diameter part 23*b* with a screw, while being closely attached to the annular flange 43 formed at the upstream end of the increased-diameter part 23*b* relative to the suction direction A. Note that the collar 45 is made of brass which is conductive; however, the collar 45 may be made of any other conductive materials.

Inside the jointing portion 41*b* is a biasing member 47. This biasing member 47 is disposed between a step portion 48 of the jointing portion 41*b* and the collar 45, and biases the filter cartridge 4 inserted into the first inner cover 23 in the suction direction A. That is, the biasing member 47 biases the filter cartridge 4 in a direction away from the first inner cover 23. The biasing member 47 is structured by a coil spring 47*a* and a pedestal 47*b* disposed between the coil spring 47*a* and the collar 45. However, for example, the biasing member 47 may be structured by an elastic member such as rubber, instead of the coil spring 47*a*. Further, the pedestal 47*b* may be omitted.

Inside the main body part 22*b* of the first holder 22 is disposed a biasing member 49. The biasing member 49 is disposed between the annular flange 22*c* and the increased-diameter part 23*b*, and biases the first inner cover 23 inserted into the first holder 22 in the suction direction A. Note that the first inner cover 23 is provided with a C-shaped retaining ring 42, and is supported by the first holder 22 in such a manner that the first inner cover 23 is able to slide in the suction direction A. The biasing member 49 is structured by a coil spring; however, may be structured by an elastic member such as rubber.

As shown in FIG. 3 and FIG. 4, the second housing 3 has: a cylindrical second outer cover 51 made of an aluminum alloy; a second holder 52 made of polycarbonate resin; a cylindrical second inner cover 53 made of stainless steel, which is disposed so as to sandwich the second holder 52 between the second inner cover 53 and the second outer cover 51; and a joint holder 54 made of polycarbonate resin, which is disposed so as to sandwich the second outer cover 51 between the joint holder 54 and the second holder 52. The second outer cover 51 and the second inner cover 53 are electrically insulated from each other. Note that the second outer cover 51 may be made of a conductive material such as aluminum, copper, and a magnesium alloy. Further, the second inner cover 53 may be made of a conductive material other than stainless steel. The second holder 52 and the joint holder 54 may be made of an insulative material other than polycarbonate resin.

At the downstream end of the second outer cover 51 relative to the suction direction A is an annular flange 61. The annular flange 61 has a hole 61*a* into which a part of the second holder 52 is inserted. The annular flange 61 has a hole 61*b* into which the coaxial cable 13 connected to the electric potential meter 14 is inserted. The outer shield line of the coaxial cable 13 is connected to the second outer cover 51 and the core line is connected to the second inner cover 53.

Figure 6:
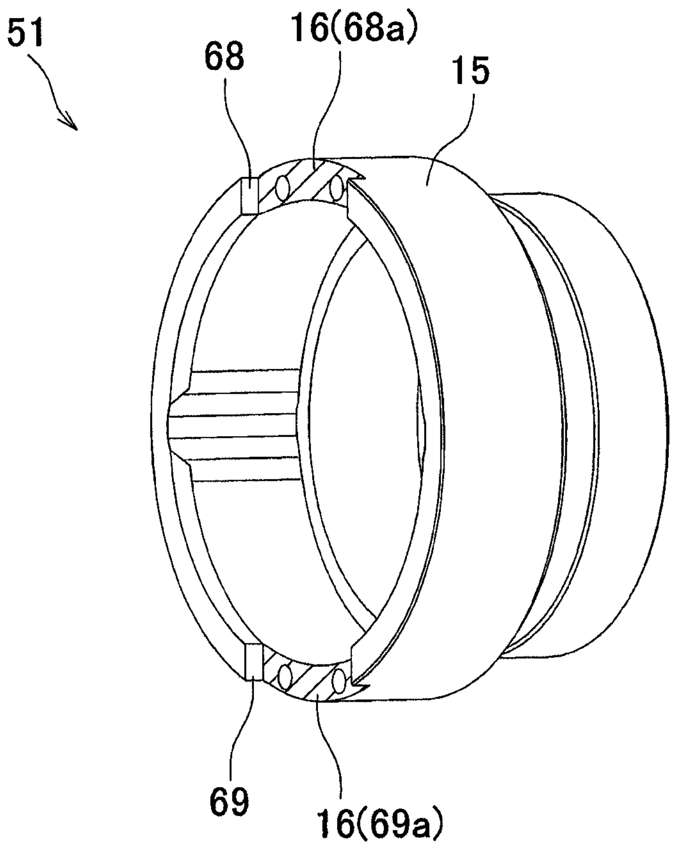
FIG. 6 is a perspective diagram of the second outer cover shown in FIG. 2 and shows that a projection forming member is detached from the cover.

As shown in FIG. 4, the second outer cover 51 has, at its upstream end relative to the suction direction A, two projections 51*a* and 51*b* which project from the inner circumferential surface. These projections 51*a* and 51*b* are structured by the two projection forming members 66 and 67 fixed to the base material of the second outer cover 51. The projection forming members 66 and 67 are made of a conductive material such as stainless steel. Specifically as shown in FIG. 6, two notches 68 and 69 are formed at the upstream end of the second outer cover 51. These notches 68 and 69 are point-symmetrical to each other about the center axis of the second outer cover 51. As shown in FIG. 4, the projection forming members 66 and 67 are fit into the notches 68 and 69 and are fixed to the second outer cover 51 by screws, in such a manner that the leading end portions (projections 51*a* and 51*b*) project from the inner circumferential surface of the second outer cover 51. The respective shapes of the portions of the projection forming members 66 and 67 projecting from the inner circumferential surface of the second outer cover 51 are shapes that correspond to those of the notches 38*a* and 38*b*, respectively. Thus, after the first and second outer covers 21 and 51 are fit together, the first and second outer covers 21 and 51 are coupled with each other by rotating the first housing 2 by 90° in the circumferential direction so that the projections 51*a* and 51*b* are engaged with the annular projection 33 in the fitting direction parallel to the suction direction A. As should be understood, the projections 51*a* and 51*b* and the annular projection 33 constitute a lock mechanism for locking the both housings 2 and 3.

Further, the second outer cover 51 also has on its entire surface, an insulative hard coating 15 formed by anodizing. As is the case with the hard coating 10, the hard coating 15 is also approximately 30 μm in thickness; however the thickness of the hard coating 15 may be any thickness within a range from 10 μm, inclusive, to 100 μm, inclusive. Note that the hard coating 15 may be also formed by various surface treatments or other treatments, as is the case with the hard coating 10.

As is hatched in FIG. 6, there are two contact areas 16 having no hard coating 15, which are formed on the surfaces 68*a* and 69*a* of the notches 68 and 69, respectively. These surfaces 68*a* and 69*a* contact the projection forming members 66 and 67, when the projection forming members 66 and 67 are fixed on the notches 68 and 69. Thus, the projection forming members 66 and 67 and the base material of the second outer cover 51 are electrically connected. The projection forming members 66 and 67 of the present embodiment are fixed to the base material of the second outer cover 51 on which the hard coating 15 is formed by anodizing, with the contact areas 16 being masked. Therefore, no hard coating 15 is formed on the projection forming members 66 and 67. When the both housings 2 and 3 are coupled with each other, the contact area 11 of the first outer cover 21 and the projection forming members 66 and 67 contact each other and are electrically connected. Note that the hard coating 15 is not formed on the entire surfaces of the projection forming members 66 and 67, and the surfaces themselves serve as the contact areas. These surfaces are made of stainless steel and are harder than the base material of the second outer cover 51, as such. Thus, when the covers 21 and 51 are coupled with each other, it is possible to restrain chipping off, galling, or the like, which is attributed to friction of the covers at the fitting area. Further, the contact areas 16 may be formed by conducting a machining process after anodizing, as in the case described above.

In the present embodiment, the projection forming members 66 and 67 and the second outer cover 51 may be formed in one piece. In that case however, the contact areas without the hard coating is formed in the areas within the fitting area in which the first and second outer covers 21 and 51 are fit together, when the both housings 2 and 3 are coupled with each other, so that the contact areas face the contact areas 11. In other words, the hard coating 15 may be formed in the entire fitting area, except for the contact areas. Further, the hard coating may be formed only on the leading end surface of the projections 51*a* and 51*b* which face the bottom surface of the groove 32. As long as the hard coating is formed, it is possible to restrain the chipping off, galling, or the like, which is attributed to the friction of the covers in the fitting area at the time of coupling the both covers.

As shown in FIG. 3, the second holder 52 has substantially a disc-like shape, and the surface thereof facing the second inner cover 53 has a recess 63 in which the downstream end of the second inner cover 53 relative to the suction direction A is fit. At the center of the bottom surface of the recess 63 is a hole 64 which constitutes the air outputting route for the air output from the filter cartridge 4. As shown in FIG. 4, the surface of the second holder 52 opposite to the surface on which the recess 63 is formed has an annular projection 52*a* having the hole 64, which is inserted into the hole 61*a*. Further, the second holder 52 has a hole 52*b* having substantially the same diameter as that of the hole 61*b*. The hole 52*b* faces the hole 61*b* when the second holder 52 is fixed to the second outer cover 51. Into this hole 52*b*, too, is inserted the core line of the coaxial cable 13 connected to the second inner cover 53 and the insulative member covering the core line.

As shown in FIG. 4, the second inner cover 53 has an inner circumferential surface having: a taper surface 53*a* which is tilted from the suction direction A; a straight surface 53*b* which extends in the suction direction A; and a curved surface 53*c* connecting the taper surface 53*a* and the straight surface 53*b*. Further, at the end portion on the outer circumference of the second inner cover 53 opposite to the second holder 52, an annular projection 65 projecting in the radial directions is formed. The outer diameter of the annular projection 65 is the same as the largest outer diameter of the increased-diameter part 23*b* of the first inner cover 23. The second inner cover 53 is fixed onto the second holder 52 with a screw from the outside the second holder 52, while the downstream end of the second inner cover 53 relative to the suction direction A is fit in the recess 63.

As shown in FIG. 4, the joint holder 54 has an inner tube 71 fit between the hole 61*a* of the annular flange 61 and the annular projection 52*a* of the second holder 52; an outer tube 72 disposed outside the inner tube 71; and an annular flange 73 connecting the inner and outer tubes 71 and 72. On the inner circumferential surface of the inner tube 71 is a female thread which is formed from the vicinity of the middle portion to the downstream end of the inner tube 71 relative to the suction direction A, and a connection member 70 is screwed into this female thread.

Further, the annular projection 52*a* of the second holder 52 is fit into the upstream end portion of the inner tube 71. On the outer circumferential surface of the annular projection 52*a* is formed an annular groove on which an O-ring is disposed. With this, the sealing property between the inner tube 71 and the second holder 52 is improved. Note that screwing the second holder 52 from outside the joint holder 54 fixes the second outer cover 51, the second holder 52, and the joint holder 54, while sandwiching the annular flange 61 between the joint holder 54 and the second holder 52.

The filter unit 5 is provided outside the casing 1*a* through the connection member 70 and the piping members 6. The filter unit 5 has a cylindrical resin case 7, a filter member (second filter) 8 accommodated in the resin case 7. The resin case 7 has a transparent cylindrical main body part 7*a*; connecting portions 7*b* connecting the piping members 6 at both ends of the main body part 7*a*. Each of the connecting portions 7*b* is structured so that the piping member 6 is attached or detached through a simple operation. Thus, the filter unit 5 is easily attached to or detached from the piping members 6.

The filter member 8 is accommodated in the main body part 7*a*. By accommodating the filter member 8 in the main body part 7*a* which is entirely the light-transmissive area, it is possible to know at one glance whether or not the filter unit 5 has collected the fine particles which are essentially supposed to be collected by the later-described filter 83. This way, a damage to the filter 83 or an absence of the filter 83 is surely confirmed. Further, the filter member 8 is a hollow fiber membrane filter and the filtration accuracy thereof is higher than that of the filter 83 accommodated in the filter cartridge 4. That is, for example, when the filter 83 is a filter paper of 1.0 μm or 0.7 μm in particle retention capacity, the filter member 8 is a hollow fiber membrane filter of 0.01 μm in filtration accuracy.

Figure 7:
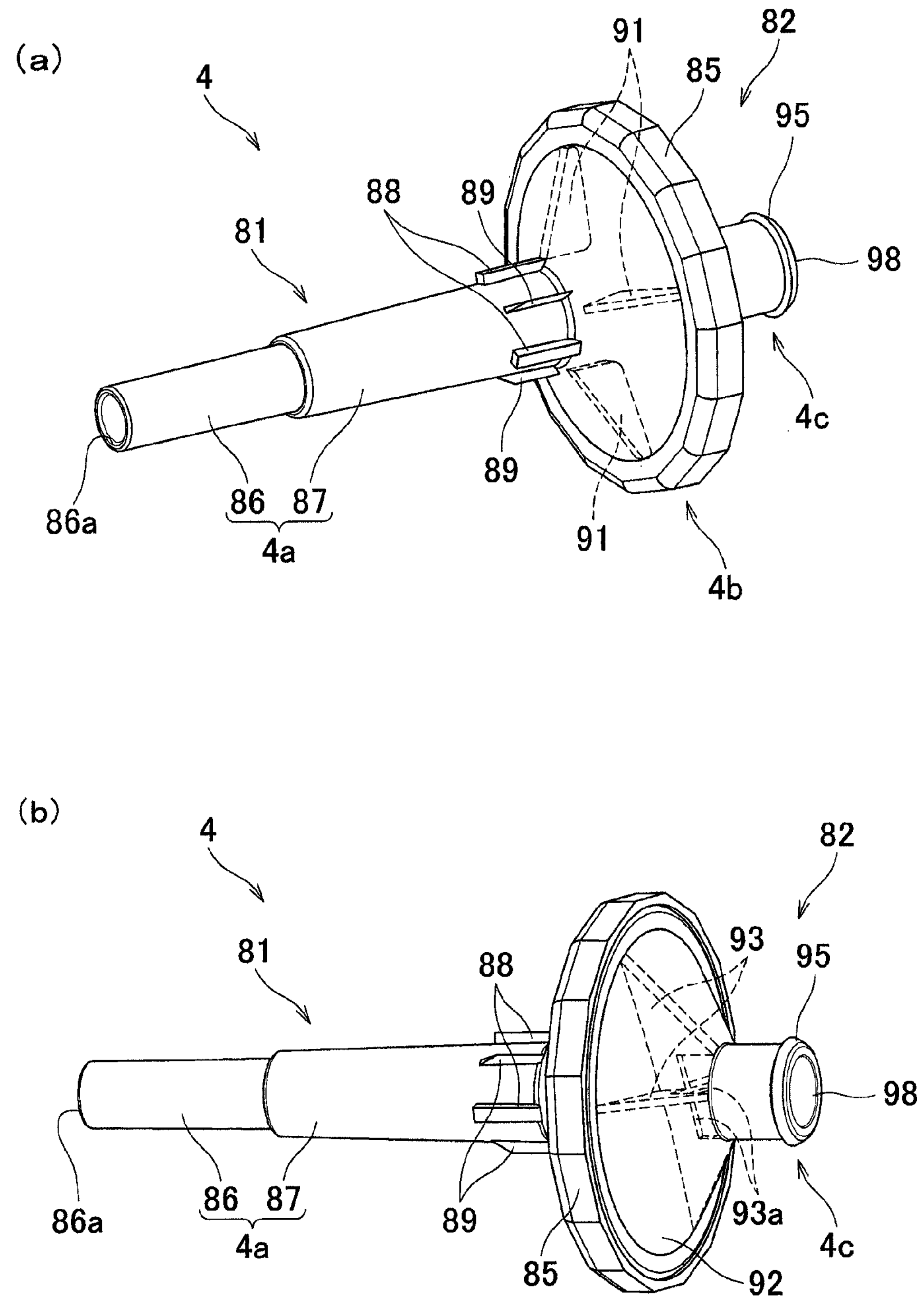
FIG. 7 includes (a) which is a perspective diagram of the filter cartridge viewed from the upstream relative to the suction direction, and (b) which is a perspective diagram of the filter cartridge viewed from the downstream relative to the suction direction.
Figure 8:
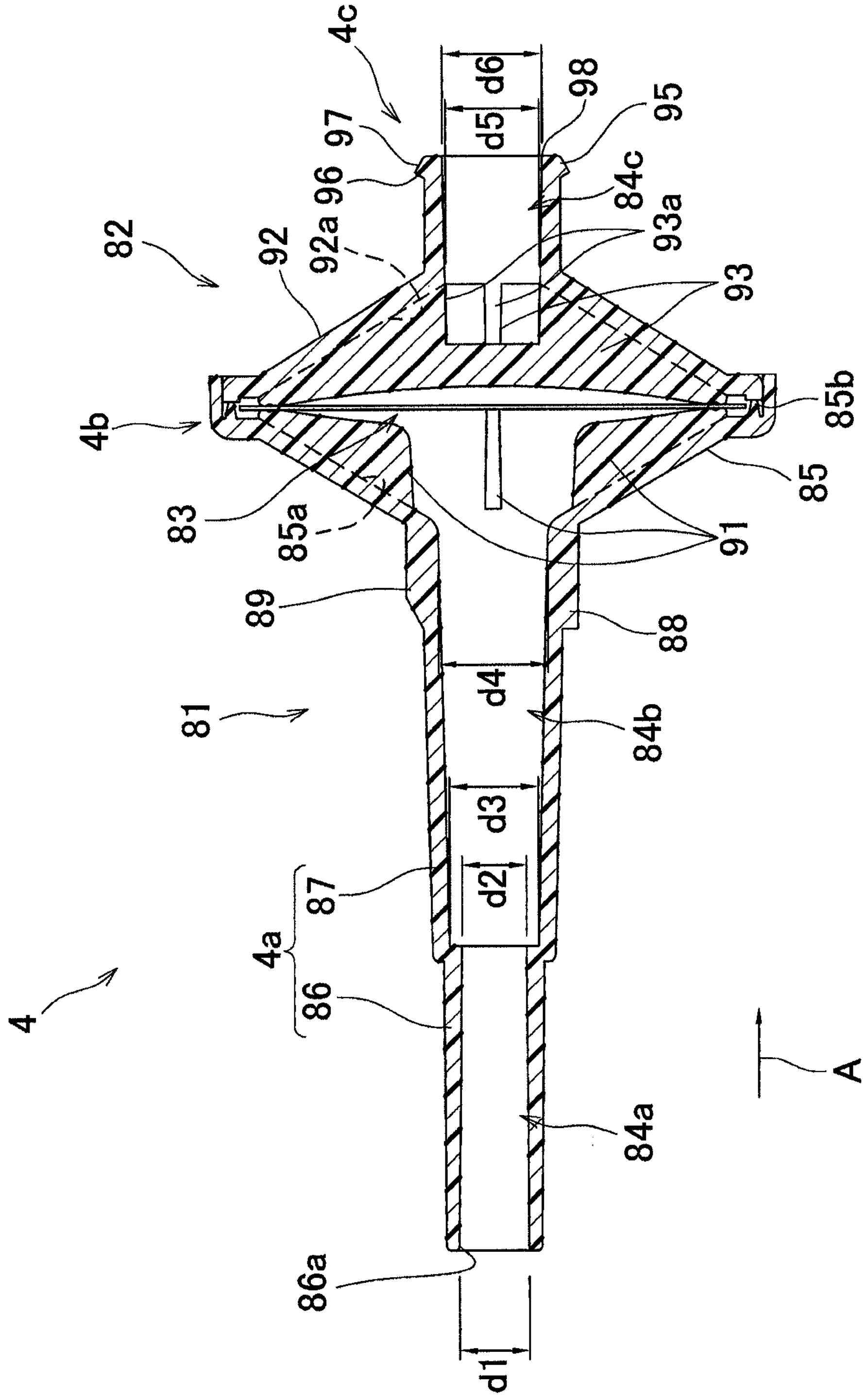
FIG. 8 is a cross sectional view of the filter cartridge shown in FIG. 3.

Next, the filter cartridge 4 is described below. As shown in FIG. 7 and FIG. 8, the filter cartridge 4 includes two housings 81 and 82 which fit each other, and the filter (first filter) 83 accommodated in the both housings 81 and 82. These two housings 81 and 82 are fit together to structure a single container.

The two housings 81 and 82 are made of polypropylene resin which is an insulative material. However, the two housings 81 and 82 may be entirely conductive by forming them with polypropylene resin to which fine metal particles as a conductive material are added. The container of the filter cartridge 4 is made of a synthetic resin, and therefore the weight thereof is made approximately 2 to 3 g. That is, the weight of the filter cartridge 4 is made closer to that of the fine particles to be sucked in. Supposing that a filter is provided in a metal container, the weight is heavy and is approximately 100 g. If the measurement range of the electronic balance 18 is set to 0.01 mg, to accurately measure the total weight of the fine particles collected by the metal container and the metal container itself, the total weight is too heavy to measure. Setting the measurement range to a greater value for measuring the total weight of the metal container and the fine particles, the measurement accuracy will drop. However, in the present invention, the weight of the filter cartridge 4 is made light and is approximately 2 to 3 g, the total weight of the filter cartridge 4 and the fine particles is measurable even if the measurement range is set to 0.01.

In the present embodiment, polypropylene resin to which a metallic fine powder is added is used as the material for the housings 81 and 82 instead of the insulative material. In this case, the material is not particularly limited provided that the conductivity is achieved. For example, a conductive material other than the fine metal particles such as metal fiber or carbon black may be used. Further, the resin may be a synthetic resin other than the polypropylene resin such as polyethylene resin or any styrene based resin.

The surface conductivity of the synthetic resin in general is $10^{-14}$ $Scm^2$. This surface conductivity is preferably made $10^{-11}$ $Scm^2$ or more in the present embodiment, by adding a conductive material in the synthetic resin. It is further preferable to achieve the surface conductivity of $10^{-9}$ $Scm^2$ more.

Further, the synthetic resin forming the housings 81 and 82 of the present embodiment may be any synthetic resin, as long as the synthetic resin is a material having transparency that the inside status can be seen from the outside. For example, when a milk white resin is used, making the thickness of the filter cartridge 4 relatively thin makes the filter cartridge 4 semi-transparent which enables confirmation of whether the filter cartridge 4 is a used filter cartridge 4 having sucked in the fine particles. In this case, substantially the entire filter cartridge 4 is the light-transmissive area. This enables confirmation of the status of the filter 83 accommodated in the filter cartridge 4.

Note that the amount of conductive material added to the synthetic resin is an amount that achieves a suitable surface conductivity, and achieve a suitable transparency that enables confirmation of the inside status of the filter 83 from the outside. The above mentioned effect can be achieved also by forming at least one of the housings 81 and 82 by using a transparent synthetic resin (e.g. polycarbonate resin). It is also possible to make at least a part of the housings 81 and 82 transparent. This also achieves the above mentioned effect.

The filter cartridge 4 has a cylindrical lengthy part (first cylindrical part) 4*a* extending along the suction direction A; a cylindrical increased-diameter part 4*b* whose diameter is expanded larger than the inner diameter of the downstream end of the lengthy part 4*a*; and a cylindrical shorter part (second cylindrical part) 4*c* which is shorter than the lengthy part 4*a*. The length of the lengthy part 4*a* is longer than the outer diameter of the increased-diameter part 4*b*. More specifically, it is preferable that the length of the lengthy part 4*a* be approximately the same as the outer diameter of the increased-diameter part 4*b* or a double of the outer diameter. More preferably, the length of the lengthy part 4*b* is approximately 1.2 to 1.8 times, and even more preferably 1.8 times, the outer diameter of the increased-diameter part 4*b*. This way, the leading end portion of the lengthy part 4*a* projects from the first housing 2 of the Faraday cage 1, when the filter cartridge 4 is inserted into the Faraday cage 1. This makes it easier to perform an operation of sucking in the charged fine particles from outside.

The filter 83 is a filter paper having a disc-like shape, which is selected according to the particle diameter of the fine particles to be measured. For example, a filter paper having a particle retention capacity of 1.0 μm is adopted for measuring the electric charge of the toner used in electrophotographic technology, and a filter paper having a particle retention capacity of 0.7 μm is adopted for measuring the electric charge of even finer particles.

As shown in FIG. 7, the outer circumferential side surface which is farthest apart from the center of the increased-diameter part 4*b* is chamfered to form a polygonal shape (e.g. hexadecagon). This way, the filter cartridge 4 removed from the casing 1*a* is restrained from rolling, when placed on a plane in such a manner that the outer circumferential side surface contacts the plane. Therefore, the fine particles are less likely spilled from the filter cartridge 4, and the weight of the filter cartridge 4 having collected the fine particles is stably measured.

The housing 81 has a lengthy part 4*a* and a upper half portion 85 constituting a half of the increased-diameter part 4*b* on the upstream side. The lengthy part 4*a* has: a leading end portion 86 whose outer diameter is slightly smaller than the inner diameter of the leading end portion 41*a*; and a jointing portion 87 for jointing the leading end portion 86 and the upper half portion 85, which has an outer diameter slightly smaller than the smallest inner diameter of the jointing portion 41*b*.

As shown in FIG. 8, the leading end portion 86 has a degression area 84*a* whose inner diameter is gradually decreased in the suction direction A. That is, the inner diameter d1 of the suction port 86*a* formed at the upstream end of the leading end portion 86 relative to the suction direction A is slightly larger than the inner diameter d2 at the downstream end. Further, the length of the leading end portion 86 in the suction direction A is substantially the same as that of the leading end portion 41*a*. When the filter cartridge 4 is inserted into the first inner cover 23, the upstream end of the leading end portion 86 and the upstream end of the leading end portion 41*a* are substantially in the same position. This prevents adhesion of the fine particles to the inner circumferential surface of the leading end portion 41*a*, when being sucked into the Faraday cage 1, and most of the fine particles are taken into the filter cartridge 4. Therefore, the total weight of all the fine particles whose respective electric charges have been measured is measurable by measuring the weight of the filter cartridge 4.

The jointing portion 87 has a progressive area 84*b* whose inner diameter is gradually increased in the suction direction A. That is, the inner diameter d3 at the upstream end of the jointing portion 87 relative to the suction direction A is smaller than the inner diameter d4 at the downstream end. Thus, a die for forming this lengthy part 4*a* including a leading end portion 86 having the degression area 84*a* and the jointing portion 87 having the progressive area 84*b* can be separated at the portion corresponding to the boundary between the leading end portion 86 and the jointing portion 87. This contributes to reduction of the manufacturing cost of the filter cartridge 4. Further, the jointing portion 87 has substantially the same length as the jointing portion 41*b*, relative to the suction direction A. On the outer circumferential surface at the downstream end of the jointing portion 87 relative to the suction direction A, there are three abutting portions 88 and three projections 89, each of which projects from the outer circumferential surface and extends in the suction direction A. These abutting portions 88 and the projections 89 are alternately disposed apart from one another at equal intervals, along the circumferential direction.

Each of the three abutting portions 88 has a shape of a rectangular column extending in the suction direction A, and the height thereof from the outer circumferential surface of the jointing portion 87 is lower than those of the projections 89. Specifically, when the filter cartridge 4 is inserted into the first inner cover 23, each of the abutting portion 88 passes the collar 45 without contacting the inner circumferential surface of the collar 45, and abuts the pedestal 47*b*. This way, the filter cartridge 4 is biased by the biasing member 47 in the suction direction A. Since the filter cartridge 4 is biased in the suction direction A, the downstream end of the filter cartridge 4 is pressed against one side of the second holder 52. This improves the sealing property of the connecting portion between the outlet port 98 of the filter cartridge 4 and the hole 64, and the suction force at the suction port 86*a* of the filter cartridge 4 is ensured. As the result, the fine particles are reliably sucked and collected in the filter cartridge 4, and the fine particles are kept from being sucked into a gap between the first inner cover 23 and the filter cartridge 4 from the leading end portions 41*a* and 86. To further improve the sealing property between the filter cartridge 4 and the second inner cover 53, a 2 mm thick packing made of silicon resin may be disposed on the surface of the second inner cover 53 to contact the downstream end of the filter cartridge 4.

Each of the three projections 89 has a shape of a triangular column extending in the suction direction A, and the sharp leading end of the projection 89 is positioned farthest from the outer circumferential surface of the jointing portion 87. Further, each of the projections 89 has a height such that, when the filter cartridge 4 is inserted into the first inner cover 23, the leading end of the projection 89 contacts and is crushed by the inner circumferential surface of the collar 45. Since the projections 89 and the collar 45 are engaged with each other, the filter cartridge 4 hardly falls from the first housing 2, when taking out the filter cartridge 4 from the casing 1*a*. Therefore, the fine particles are less likely spilled from the filter cartridge 4. Further, the upstream end surface of each projection 89 relative to the suction direction is slanted. This facilitates crushing of the leading end of the projection 89, when the filter cartridge 4 is inserted into the first inner cover 23. Note that, since the projections 89 and the collar 45 contact each other when the filter cartridge 4 is inserted into the first inner cover 23, the filter cartridge 4 and the first inner cover 23 are electrically connectable if the filter cartridge 4 is conductive.

As shown in FIG. 7(*a*) and the FIG. 8, there are four ribs 91 in the upper half portion 85. Each of these ribs 91 has substantially a triangular shape which extends from the vicinity of the entrance of the upper half portion 85 to the vicinity of the outer circumference end of the upper half portion 85, along a slanted surface 85*a*. These ribs 91 are disposed about the center axis of the upper half portion 85, at intervals of 90°. The downstream end surface of each rib 91 is positioned to be able to contact the upstream side surface of the filter 83 accommodated in the filter cartridge 4, so as to regulate the range of the movement of the filter 83, while the fine particles are being sucked in. This prevents the filter 83 from being largely deformed and damaged, and at the same time enables the filter 83 to reliably collect the fine particles.

Further, at the vicinity of the outer circumference end of the upper half portion 85, there is an annular weld portion 85*b* for combining the housings 81 and 82 by welding, which extends in the circumferential direction. Thus, after the housings 81 and 82 are engaged with each other with the filter 83 being sandwiched therebetween, the housings 81 and 82 can be welded by heating the weld portion 85*b* from the outside the filter cartridge 4. Note that the housings 81 and 82 may be fixed to each other by using an adhesive agent. In that case, there is no need for the weld portion 85*b*.

The housing 82 has a shorter part 4*c* and a down half portion 92 which constitute a half of the increased-diameter part 4*b* on the downstream side. The shorter part 4*c* has an outer diameter which is slightly smaller than the smallest inner diameter of the second inner cover 53. Further, at the downstream end of the shorter part 4*c* is formed an annular projection 95. The annular projection 95 has a slanted surface 96 formed on the upstream side relative to the suction direction A, and a slanted surface 97 on the downstream side. The outer diameter of the annular projection 95 is substantially the same as the smallest inner diameter of the second inner cover 53. The tilt angle of the slanted surface 97 with respect to the outer circumferential surface of the shorter part 4*c* is smaller than that of the slanted surface 96, and forms a relatively gradual slope. With this annular projection 95 on the shorter part 4*c*, the annular projection 95 is suitably caught by user's fingers, when a user holds the shorter part 4*c* by his/her fingers. This makes it easier to hold the filter cartridge 4 when the filter cartridge 4 is placed in or taken out from the casing 1*a*. Further, since the slanted surface 97 forms a gradual slope, the outer peripheral leading end of the annular projection 95 suitably sink into the fingers. As the result, the filter cartridge 4 is easy to hold.

The shorter part 4*c* has a progressive area 84*c* whose inner diameter is increased in the suction direction A. That is, the inner diameter d5 at the upstream end of the shorter part 4*c* relative to the suction direction A is slightly smaller than the inner diameter d6 at the outlet port 98 which is formed at the downstream end. The outlet port 98 has a larger diameter than the suction port 86*a*. This strengthens the suction force from the suction port 86*a*.

As shown in FIG. 7(*b*) and FIG. 8, the down half portion 92 has two substantially trapezoidal ribs 93 which perpendicularly cross each other. Each of the rib 93 extends from the boundary portion between the shorter part 4*c* and the down half portion 92 to the vicinity of the outer circumference end of the down half portion 92, along the slanted surface 92*a*. The upstream end surface of each rib 93 is in a position to be able to contact the downstream side surface of the filter 83 accommodated in the filter cartridge 4, and regulates the movement of the filter 83, while the fine particles are being sucked in. This prevents the filter 83 from being largely deformed and damaged, and at the same time enables the filter 83 to reliably collect the fine particles. Further, at the downstream end of each rib 93 is formed a notch 93*a*.

Next, the following describes with reference to FIG. 1 and FIG. 9 to FIG. 11, an operation performed in the device 100, for deriving the per-unit weight electric charge of the fine particles having been sucked into the Faraday cage 1.

Figure 9:
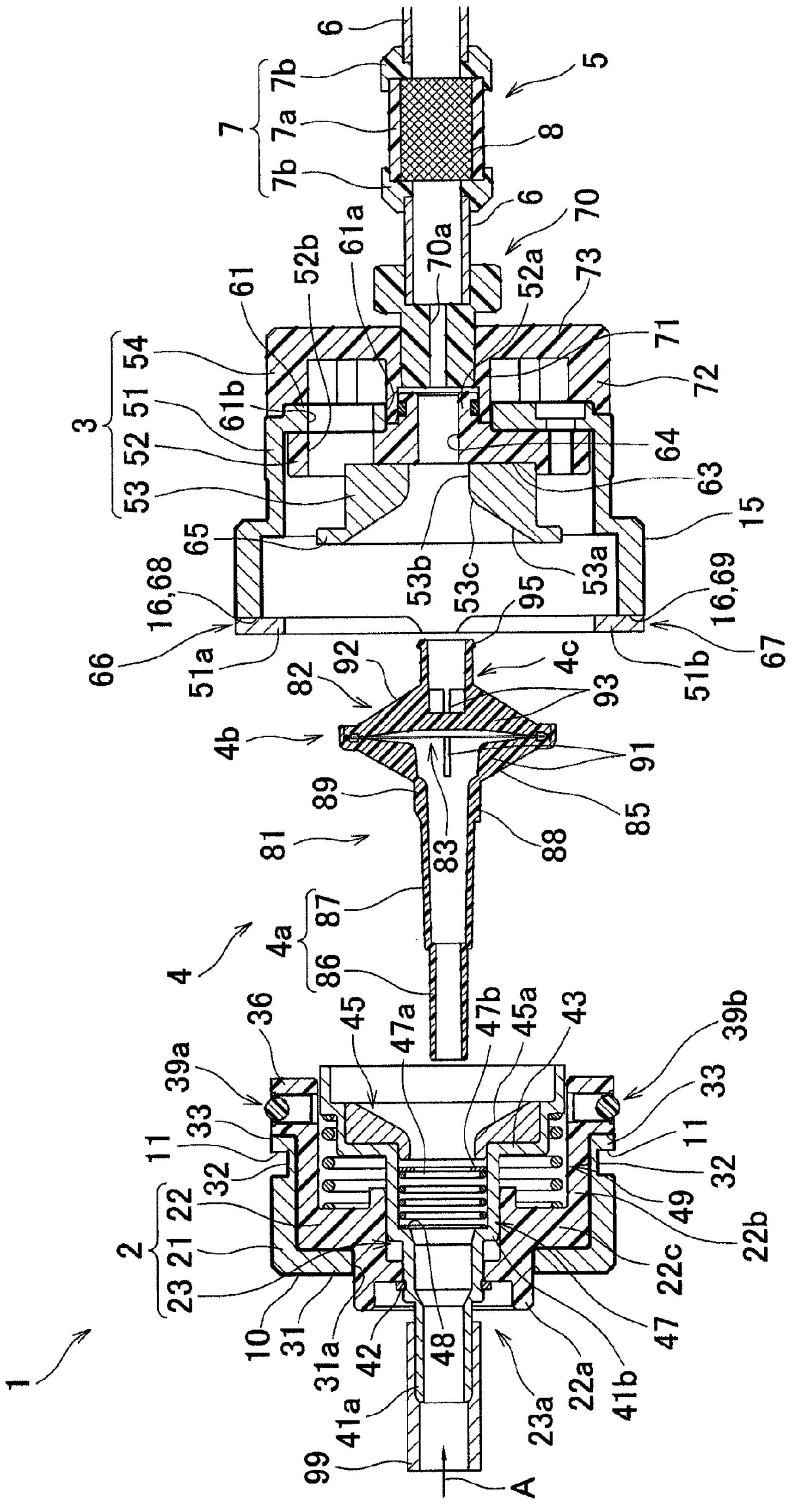
FIG. 9 is a cross sectional view at the time of putting the filter cartridge together with the first and second housing.

First, the user confirms the inside status of the filter cartridge 4 from the outside to check whether the filter cartridge is an already-used cartridge. Then, the weight of a non-used filter cartridge 4 alone is measured by the electronic balance 18. The filter cartridge 4 is then placed by the user between the first and second housings 2 and 3 which are separated from each other, as shown in FIG. 9, and the lengthy part 4*a* of the filter cartridge 4 is inserted into the lengthy part 23*a* of the first inner cover 23. At this point, the abutting portions 88 abut the pedestal 47*b*, and the respective leading ends of the projections 89 contact and are crushed by the inner circumferential surface of the collar 45. This way, the projections 89 are engaged with the collar 45. By having the three projections 89 engage with the collar 45, the center axis of the filter cartridge 4 parallel to the suction direction A substantially coincides with the center axis of the casing 1*a*. At this time, the filter cartridge 4 and the first inner cover 23 are electrically connected through the collar 45, and the filter cartridge 4 and the second inner cover 53 are electrically connected through direct contact to each other.

Next, when the both covers 21 and 51 are fit together, the both covers 21 and 51 are positioned so that the projections 51*a* and 51*b* are able to pass the notches 38*a* and 38*b*. The first and the second housings 2 and 3 are moved towards each other to fit the covers 21 and 51 together. As shown in FIG. 9, before the covers 21 and 51 are fit together, the downstream end of the first inner cover 23 relative to the suction direction A is projected from the downstream end of the first holder 22 relative to the suction direction A, due to the biasing force applied by the biasing member 49. However, as shown in FIG. 4, by fitting the covers 21 and 51 together, the downstream end surface of the first inner cover 23 contacts the upstream end surface of the annular projection 65 of the second inner cover 53, and the first inner cover 23 is pushed into the first holder 22. At this time, the biasing force from the biasing member 49 increases the pressure for pressing the downstream end surface of the first inner cover 23 against the upstream end surface of the annular projection 65. Therefore, the electric contact between the first inner cover 23 and the second inner cover 53 is made further reliable. When the first and second outer covers 21 and 51 are fit together, and the projections 51*a* and 51*b* are engaged with the annular projection 33, there could be a problem such as rattling of the covers 21 and 51, which would lead to decrease of the pressure for pressing the second inner cover 53 against the downstream end surface of the first inner cover 23. With the biasing member 49 however, the rattling of the both covers 21 and 51 is absorbed by the biasing member 49, and such a decrease in the pressure for pressing the second inner cover 53 against the first inner cover 23 is restrained.

When the both covers 21 and 51 are fit together, the biasing force from the biasing member 47 acts on the filter cartridge 4. This increases the pressure for pressing the downstream end surface of the filter cartridge 4 against the side surface of the second holder 52. As a result, the fine particles are reliably sucked and collected in the filter cartridge 4, as is hereinabove mentioned, and the fine particles are no longer inadvertently sucked into a gap between the first inner cover 23 and the filter cartridge 4. In addition, the biasing member 47 also absorbs a certain level of variation in the size of the filter cartridge 4 relative to the fitting direction.

After the first and second outer covers 21 and 51 are fit together by the user, the first housing 2 is rotated by 90°. This causes the respective resin balls of the press-fit plungers 39*a* and 39*b* to go into two curved grooves. The curved grooves are formed on the inner circumferential surface of the second outer cover 51 and are in the respective positions so as to face the annular projection 33 and overlap the projection forming members 66 and 67 in the suction direction A, respectively. Note that there are four curved grooves on the second outer cover 51, which are disposed about the center axis of the second outer cover 51, at intervals of 90°. This inhibits rotation of the first housing 2 with respect to the second housing 3. In other words, the first and the second housings 2 and 3 do not rotate with respect to each other, unless rotational forces of a certain level are applied thereto, respectively.

Further, the projections 51*a* and 51*b* are rotate by 90° from the respective positions after passing the notches 38*a* and 38*b*. This engages the projections 51*a* and 51*b* with the annular projection 33, relative to the fitting direction, and the both housings 2 and 3 are coupled with each other, thus forming the casing 1*a*. As should be understood, when the first and second outer covers 21 and 51 are fit together and rotated by 90°, the projections 51*a* and 51*b* and the annular projection 33 contact each other and the annular projection 33 and the inner circumferential surface of the second outer cover 51 contact each other. However, with the hard coating 10 or 15, occurrence of chipping off, galling, or the like is restrained. Further, the hard coating 10 or 15 is also formed on the inner circumferential surfaces of the both covers 21 and 51. This prevents continuity between the first outer cover 21 and the first inner cover 23, and between the second outer cover 51 and the second inner cover 53, even a conductive foreign matter or a water droplet enters between the first outer cover 21 and the first inner cover 23, or between the second outer cover 51 and the second inner cover 53. Therefore, the electric charge in the first and second inner covers 23 and 53 is accurately measured. Further, the respective contact areas of the both covers 21 and 51 contact each other and the covers 21 and 51 are electrically connected to each other. As is understood, the both covers 21 and 51, when coupled with each other, are electrically connected to each other, although the covers 21 and 51 have the hard coatings 10 and 15, respectively. Therefore, an influence from the external electric field is effectively eliminated, in the measurement of the electric charge inside the first and second inner covers. Note that, when the hard coating is conductive, the hard coating may be formed on the entire surfaces of the covers 21 and 51. That is, the contact areas 11 and 16 may not be formed on the covers 21 and 51. This structure also electrically connects the covers 21 and 51 when the covers 21 and 51 are coupled with each other, and brings about the above mentioned effects.

When the filter cartridge 4 is inserted, the interior surfaces of the both covers 21 and 51 having the hard coatings 10 and 15 may be charged by contacting the filter cartridge 4 or by a friction between the filter cartridge 4 and the interior surfaces of the covers 21 and 51. However, this is not a concern as long as that electric charge is taken into account, in the measurement of the electric charge. Specifically, the zero point of the electric potential meter may be adjusted. Further, the biasing force from the biasing member 49 acts in directions (parallel to the fitting direction) in which the covers 51 and 21 separate from each other. Thus, the biasing force increases the force for engaging the projections 51*a* and 51*b* with the annular projection 33 and achieves more reliable electric contact. From this standpoint, the biasing member 49 constitutes a part of the lock mechanism.

Next, the user drives the suction pump 12 to generate a suction force in the suction port 86*a* of the filter cartridge 4 coupled with the Faraday cage 1, and sucks the fine particles along with the air from the outside into the filter cartridge 4. The fine particles having been sucked in at this time are collected by the filter 83, and the air is output from the outlet port 98 towards the suction pump end through the air outputting route (the holes 64 and 70*a*, the piping members 6, and the filter unit 5). If the filter 83 of the filter cartridge 4 is not duly attached, or if the filter 83 is damaged during the operation of the suction pump 12, the fine particles having been sucked in pass the filter cartridge 4 and are output to the suction pump end. However, with the filter unit 5 on the air outputting route, the fine particles are collected by the filter member 8 of the filter unit 5 and are kept from being output to the suction pump end. Therefore, it is possible to reliably eliminate, for example, the risk of scattering, from the suction pump 12 to the outside, the fine particles having been sucked in. Further, since the main body part 7*a* of the filter unit 5 is transparent, whether or not the fine particles have been collected by the filter unit 5 is confirmed at one glance. Note that, when the fine particles are collected by the filter unit 5, the filter cartridge 4 is exchanged with the one without any defect, and the fine particles are sucked in again.

Figure 10:
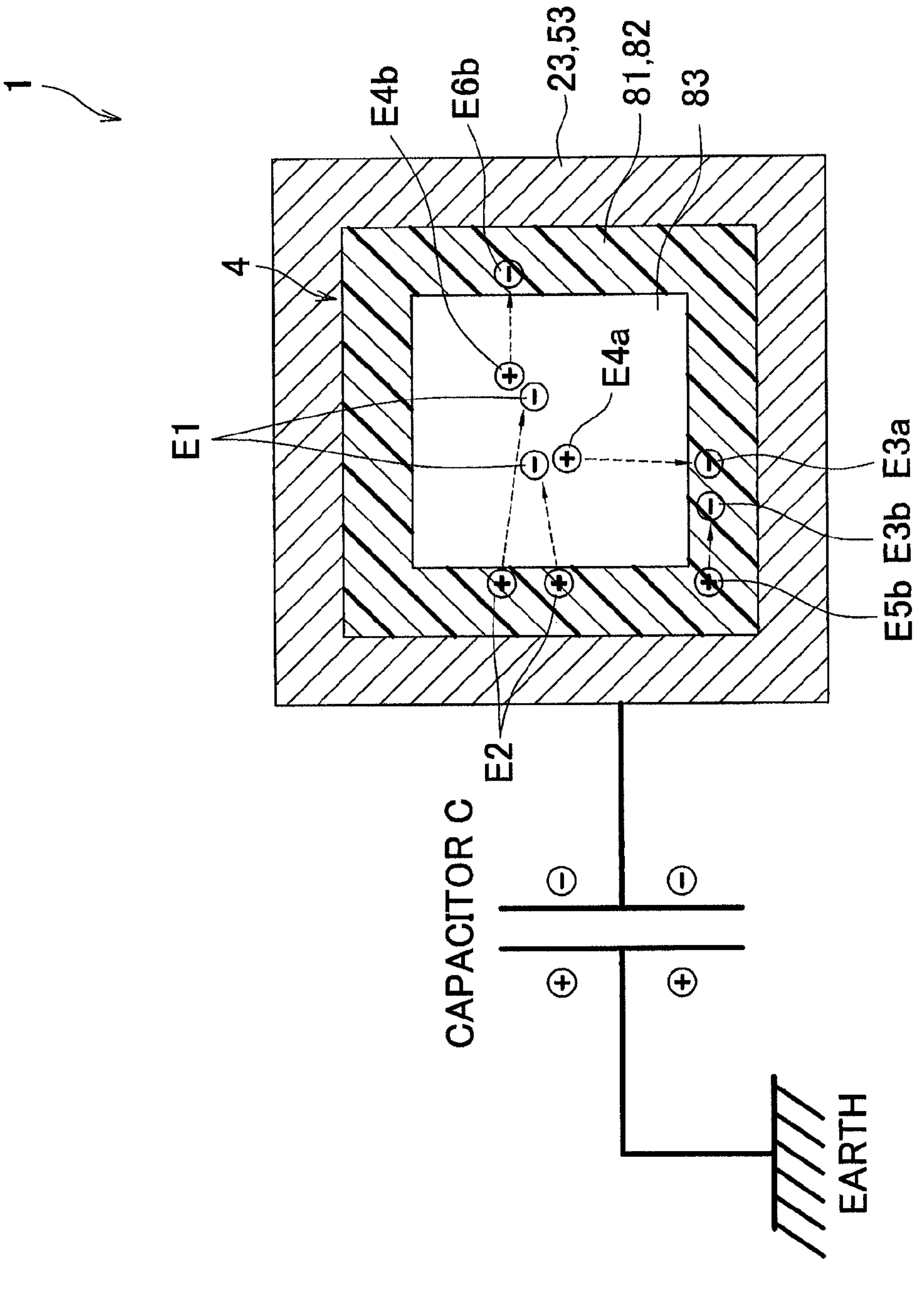
FIG. 10 is a schematic cross sectional view showing the status of charge on the filter cartridge, at the time of measuring the electric charge of the fine particles sucked in by using the Faraday cage.

Next, the user stops driving the suction pump 12, and if the filter unit 5 collects no fine particles, the total electric charge of the fine particles inside the filter cartridge 4 is measured. As shown in FIG. 10, for an electric charge E1 (e.g. negative charge) of the fine particles collected in the filter cartridge 4, an equal quantity of opposite charge E2 (positive charge) occurs in the filter cartridge 4 due to electrostatic induction. When the fine particles are sucked in, triboelectric charging occurs to the fine particles on the interior wall of the filter cartridge 4. As a result, charges E3*a* and E3*b* (e.g. negative charges) occur on the interior surface of the filter cartridge 4 and charges E4*a* and E4*b* (positive charges) occur on the fine particles. As shown in FIG. 10, the charges E3*a* and E4*a* are paired with a closed electric line of force (arrowed with a broken line in FIG. 10). The charges E3*b* and E4*b* on the other hand do not practically pair with each other and do not close an electric line of force. The latter case is believed to occur because a fine particle having the charge E4*b* separates, due to the movement of that particle inside the cartridge, from the part of the interior wall of the filter cartridge 4 where the charge E3*b* occurred. For the two charges E3*b* and E4*b*, equal quantities of opposite charges E5*b* and E6*b* occur in the filter cartridge 4 due to electrostatic induction. For each of the charges E2, E5*b*, and E6*b* occurred in the filter cartridge 4, an equal quantity of charge occurs at the capacitor C formed between the first and second inner covers 23 and 53 of the Faraday cage 1 and the first and second outer covers 21 and 51 (earth in the figure). Meanwhile, since the respective quantities of two charges E5*b* and E6*b* are equal to each other and the respective polarities thereof are opposite to each other, the charges E5*b* and E6*b* are canceled, and an equal quantity of charge to the charge E2 is accumulated at the capacitor C at the end. The charge E1 of the fine particles collected in the filter cartridge 4 is measured by using the electric potential meter 14 to measure the electric charge occurred at the capacitor C, whose quantity is equal to the charge E2. With the above measurement, the original electric charge E1 of the fine particles is measured without an influence from the charges E3*a*, E3*b*, E4*a*, and E4*b* which are caused by triboelectric charging.

Next, the total weight of the filter cartridge 4 and the fine particles collected is measured. In this case, the filter cartridge 4 with the fine particles being collected therein is taken out from the casing 1*a* by reversing the above described procedure. That is, the first housing 2 is rotated by 90°, and the both housings 2 and 3 are moved in directions to separate from each other. Then, the filter cartridge 4, which is supported by the first inner cover 23 by having the projections 89 engaged with the collar 45, is taken out from the first inner cover 23.

Figure 11:
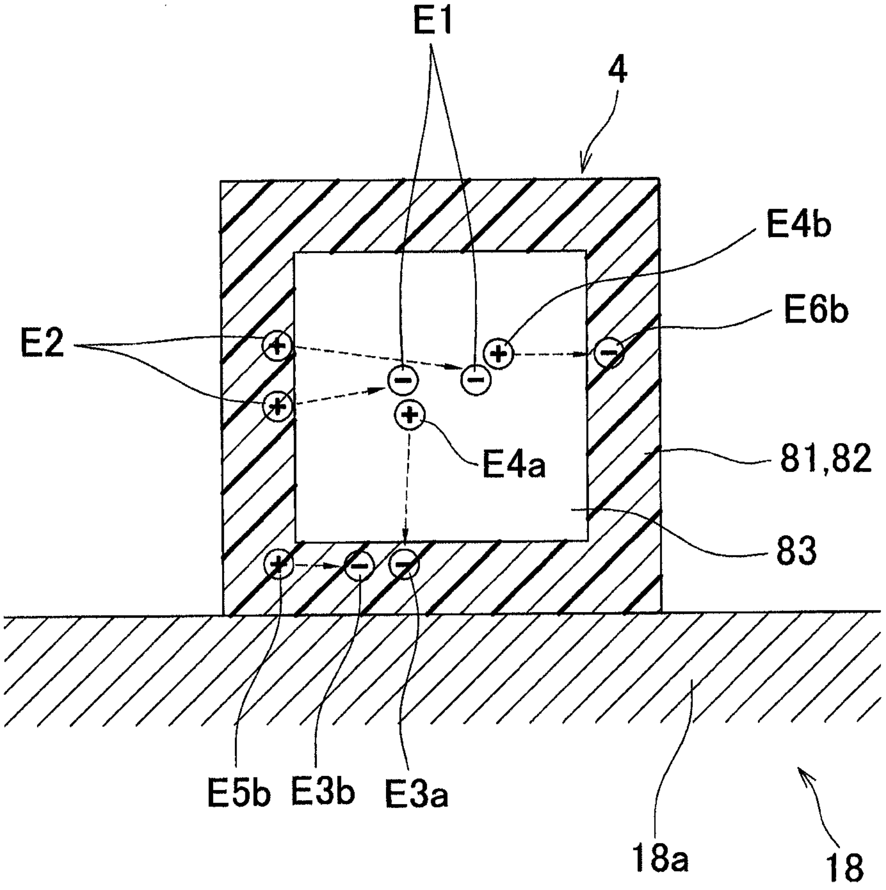
FIG. 11 is a schematic cross sectional view showing the status of charge on the filter cartridge, at the time of measuring the weight of the filter cartridge with a use of the electronic balance, after the electric charge of the fine particles sucked in is measured.

Next, as shown in FIG. 11, the user places the filter cartridge 4 on a measuring plate 18*a* of the electronic balance 18. At this time, the filter cartridge 4 is placed on the measuring plate 18*a* so that the lengthy part 4*a* of the filter cartridge 4 is at the higher level than the shorter part 4*c*, i.e., the downstream end of the shorter part 4*c* and the outer circumference end of the increased-diameter part 4*b* contact the measuring plate 18*a* of the electronic balance 18. This prevents scattering of the fine particles collected by the filter 83, from the suction port 86*a*.

Then, the user measures the total weight of the filter cartridge 4 and the fine particles by the electronic balance 18. At this time, the status of the charge in the filter cartridge 4 as shown in FIG. 10 is maintained. That is, as shown in FIG. 11, equal quantities of opposite charges E2, E5*b*, and E6*b* occur in the filter cartridge 4 due to electrostatic induction caused by the charge E1 of the fine particles, the charge E3*b* on the interior surface of the filter cartridge 4 and the charge E4*b* occurred on the fine particles which are caused by triboelectric charging, respectively. Thus, the electric lines of force are closed between the charge E1 and the charge E2, the charge E3*b* and the charge E5*b*, and the charge E4*b* and the charge E6*b*, respectively, and these charges E1, E3*b*, and E4*b* do not influence the outside the filter cartridge 4. Note that the electric line of force from the charge E4*a* is closed by the charge E3*a*. Therefore, even when the filter cartridge 4 is placed on the measuring plate 18*a*, a charge causing a coulomb attraction between the filter cartridge 4 and the measuring plate 18*a* does not occur on the measuring plate 18*a*. The charge on the windshield member of the electronic balance, which is constituted by an insulative glass, also causes no coulomb attraction between windshield member and the filter cartridge 4. Therefore, the filter cartridge 4 is highly accurately measured by the electronic balance 18. Note that, because the container of the filter cartridge 4 is made of a conductive material, the charge E3*b* and the charge E5*b* may be discharged from the filter cartridge 4 through the measuring plate 18*a*. Further, the charge E3*b* and the charge E5*b* may be discharged from the filter cartridge 4 to the user or the air, when the user holds the filter cartridge 4.

Next, from the total weight of the filter cartridge 4 resulting from the above measurement, there is subtracted the weight of the filter cartridge 4 itself which is measured before the filter cartridge 4 is attached to the casing 1*a*. This way a difference in the weight is calculated. Then, to calculate per-unit weight electric charge of the fine particles, the total electric charge of the fine particles is divided by the above calculated difference in the weight.

As described, with the present embodiment, simply by fitting the both covers 21 and 51 together and rotating the first housing 2 by 90° in a circumferential direction, the lock mechanism is able to engage the both housings 2 and 3 with the filter cartridge 4 being attached thereto. Since the structure of this lock mechanism for engaging the both housings 2 and 3 is simplified, the filter cartridge 4 is easily placed in or taken out from the casing 1*a*. Further, preparation for a subsequent measurement simply requires replacement of the filter cartridge 4 with a new one. There is no longer a need for disassembling the suction nozzle or the like and clean the same. Therefore, the workability of the measurement is improved.

Further, when the both housings 2 and 3 are engaged with each other, the electric contact between the first and second outer covers 21 and 51 and the electric contact between the first and second inner covers 23 and 53 are firmly maintained. It is therefore possible to accurately measure the electric charge in the space closed by the first and second inner covers 23 and 53. At the same time, with the electrically contacted first and second outer covers 21 and 51, the influence of an external electric field is effectively eliminated, when measuring the electric charge in the space closed by the first and second inner covers 23 and 53.

Further, since the hard coatings 10 and 15 are formed on the fitting areas of the covers 21 and 51, respectively, it is possible to restrain the chipping off, galling, or the like, which is attributed to the friction of the covers 21 and 51 in the fitting area at the time of coupling the both covers 21 and 51. The covers 21 and 51 can be repetitively coupled with or separated from each other. Further, since the covers 21 and 51 are made of an aluminum alloy and the hard coatings 10 and 15 are formed by anodizing, the respective weights of the both covers 21 and 51 are made relatively light, and therefore the entire weight of the Faraday cage is reduced.

Since the filter unit 5 is provided outside the casing 1*a*, the casing 1*a* is downsized as compared with the case of providing the filter unit in the casing. Further, the provision of the filter unit 5 outside the casing 1*a* is confirmed at one glance, and exchanging of the filter unit 5 is made easier. The filtration accuracy of the filter member 8 of the filter unit 5 is higher than that of the filter 83. Therefore, it is possible to reliably collect particles having passed the filter cartridge 4, the fine particles having a particle diameter which is too small for the filtration accuracy of the filter 83.

Further, since substantially the entire filter cartridge 4 is a light-transmissive area, it is possible to easily confirm whether the filter cartridge 4 is a new one or one which is already used and have collected the fine particles. This prevents inadvertent usage of an already-used filter cartridge.

In the present embodiment, substantially the entire filter cartridge 4 is the light-transmissive area. However, the light-transmissive area may be formed partially on any one of the lengthy part 4*a*, the increased-diameter part 4*b*, and the shorter part 4*c*. Such a structure also enables confirmation of whether or not the filter cartridge is a used one. Further, the light-transmissive area may be formed at a portion of the increased-diameter part 4*b*, upstream from the filter 83. This structure enables confirmation of the fine particles collected by the filter 83 through the light-transmissive area, in addition to the above-described effect. Therefore, it is possible to reliably prevent a usage of an already-used filter cartridge. To partially provide the light-transmissive area on the filter cartridge, an opening is formed on a part where the light-transmissive area is to be provided, and a transparent film or resin plate for covering the opening is welded or adhered to the filter cartridge.

When measuring the weight of the filter cartridge 4 having sucked in the fine particles, the charges E1, E3*b*, and E4*b* do not influence the outside the filter cartridge 4. Further, the electric line of force from the charge E4*a* is closed by the E3*a*. Therefore, the weight of the filter cartridge 4 is highly accurately measured. This enables accurate calculation of the per-unit electric charge of the fine particles.

The following discusses, as a comparative example, a case where no conductive material is added to the filter cartridge 4; i.e., where the housings 81 and 82 are made of only a synthetic resin. In this case, since no electrostatic induction takes place in an insulator, the charges E2, E5*b*, and E6*b* shown in FIG. 10 will not occur inside the filter cartridge 4 but in the first and second inner covers 23 and 53 of the Faraday cage 1. For the charges E2, E5*b*, and E6*b*, equal quantity of charges occur in the first and second inner covers 23 and 53 of the Faraday cage 1, and then at the capacitor C formed between the first and second inner covers 23 and 53 and the first and second outer covers 21 and 51, as is the case of FIG. 10. At the end, an amount of charge that equals to the charge E1 remains at the capacitor C, and hence measurement of the charge E1 of the fine particles collected in the filter cartridge 4 is possible.

The difference will be seen from the status of FIG. 11, when the user places the filter cartridge 4 on the measuring plate 18*a* of the electronic balance 18. Specifically, there will be no charges E2, E5*b*, and E6*b* which are present in the filter cartridge 4 shown in FIG. 11, and the electric lines of force from the charges inside the filter cartridge are not closed within the filter cartridge. As a result, the charges E1, E3*b*, and E4*b* in the filter cartridge 4 cause electrostatic induction to cause occurrence of opposite charges on the measuring plate 18*a*. As a result, the coulomb attraction occurs between these charges. The coulomb attraction also takes place between the charges inside the filter cartridge 4 and the charges occurring on the windshield member of the electronic balance, which is made of an insulative glass. Due to these coulomb attractions, the measurement value is unstable. As is understood from the above, a filter cartridge made of an insulative material does not have the advantage of confining therein the electric line of force of the charges inside the filter cartridge; however, such a filter cartridge is advantageous in terms of cost, because there is no need for adding a conductive material to the synthetic resin, or no need of applying such a material on the exterior surface of the synthetic resin. The filter cartridge made of an insulative material is therefore suitable for occasions of measuring only the electric charge of all the fine particles sucked in, and not the per-unit weight electric charge of the fine particles.

The housings 81 and 82 of the filter cartridge 4 of the present embodiment is made of a synthetic resin to which a conductive material is added. However, the filter cartridge 204 may be such that the conductivity is realized on the entire exterior surface of a container constituted by the housings 81 and 82. This modification is described below with reference to FIG. 12 and FIG. 13. Note that the elements and parts that are identical to those of the above embodiment are given the same reference numerals, and no further explanation therefor is provided below.

Figure 12:
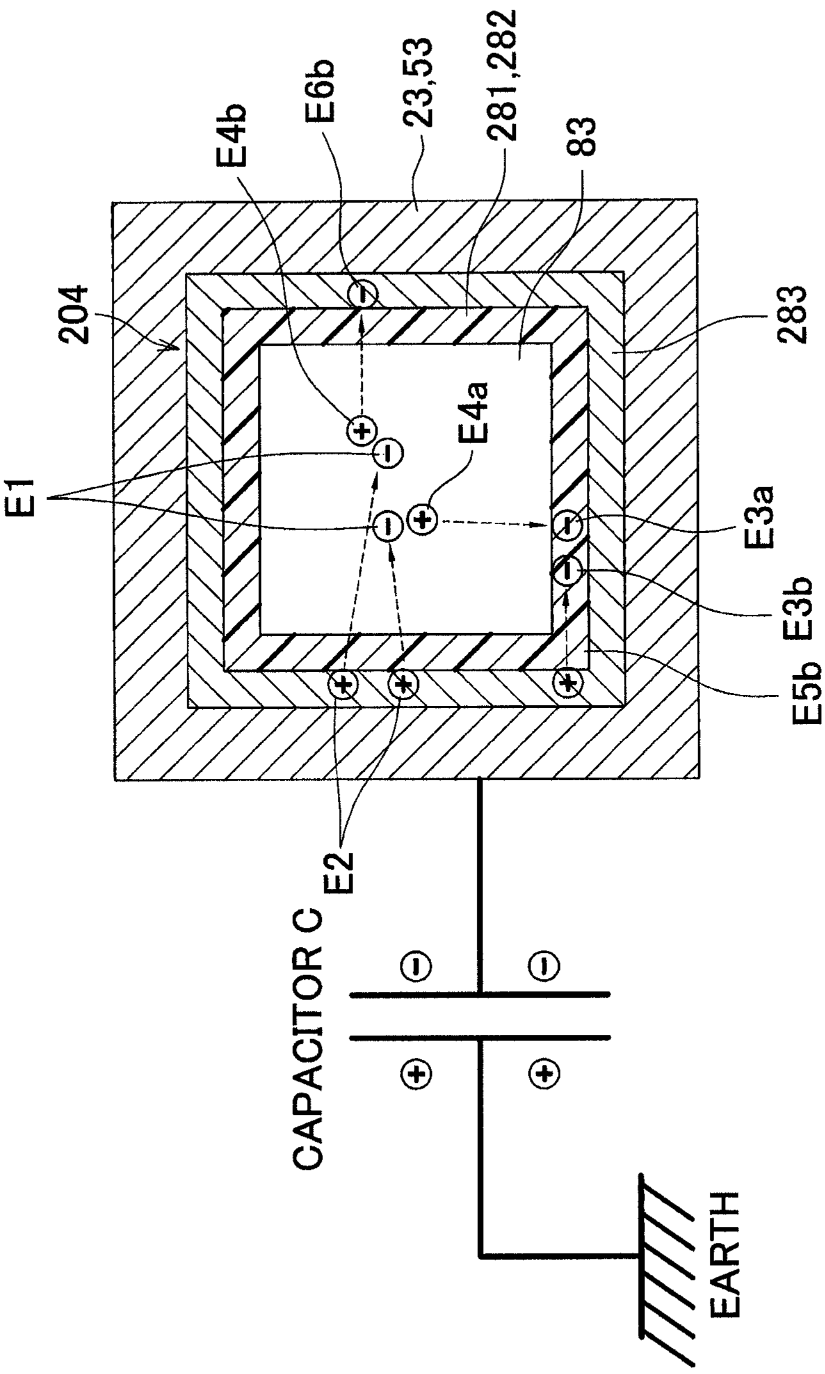
FIG. 12 shows a modification of the filter cartridge of the embodiment, according to the present invention, and is a schematic cross sectional view showing the status of charge on the filter cartridge, at the time of measuring the electric charge of the fine particles sucked in by using the Faraday cage.

As shown in FIG. 12, in the filter cartridge 204 of the present modification, two housings 281 and 282 constituting the container is made of a polypropylene resin to which no conductive material is added, and a conductive film 283 is formed on the entire exterior surface of these housings. The conductive film 283 may be, for example, a material made by mixing conductive fine particles such as fine metal particles in a binder material. However, the material of the conductive film 283 is not particularly limited as long as the material is conductive. The surface conductivity is preferably $10^{-11}$ $Scm^2$ or higher, and more suitably $10^{-9}$ $Scm^2$ or higher, as is mentioned hereinabove.

With the formation of the conductive film 283 on the entire exterior surface of the filter cartridge 204, the surface of the conductive film 283 facing the housings 281 and 282 is in the same status as those of the housings 81 and 82 of FIG. 10, at the time of measuring the total electric charge of the fine particles. That is, as shown in FIG. 12, the electric charge E1 of the fine particles collected in the filter cartridge 204 causes electrostatic induction to cause occurrence of an equal quantity of opposite charge E2. Further, of the charges E3*a*, E3*b*, E4*a*, and E4*b* which are caused by triboelectric charging, the charges E3*b* and E4*b* cause electrostatic induction to cause occurrence of equal quantities of opposite charges E5*b* and E6*b*, respectively.

Figure 13:
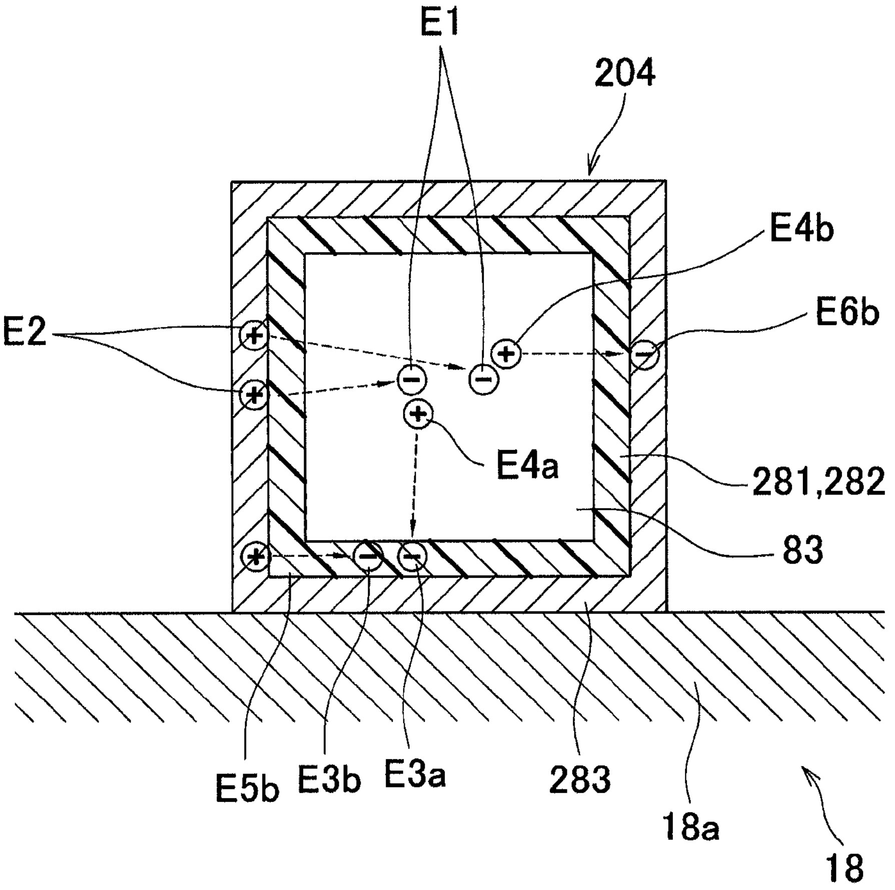
FIG. 13 shows a modification of the filter cartridge of the embodiment, according to the present invention, and is a schematic cross sectional view showing the status of charge on the filter cartridge, at the time of measuring the weight of the filter cartridge with a use of the electronic balance, after the electric charge of the fine particles sucked in is measured.

When the total weight of the filter cartridge 204 and the fine particles collected therein is measured, the user places the filter cartridge 204 on the measuring plate 18*a* of the electronic balance 18, as shown in FIG. 13. At this time, the charge in the filter cartridge 204 is maintained at the status as shown in FIG. 12. In this modification, the charge E3*b* is in the housings 281 and 282 which are insulative, and is not able to move. Meanwhile, the charge E5*b* is a charge occurring due to electrostatic induction caused by the charge E3*b*, and is not able to move. This status therefore is different from that of FIG. 11 in that the charges E3*b* and E5*b* are not discharged from the filter cartridge 204 through the measuring plate 18*a*, the user, and the air. However, the electric line of force from the charge E3*b* is closed by the charge E5*b*. Therefore, it is possible to highly accurately measure the weight of the filter cartridge 204 by the electronic balance 18, as in the case of the above embodiment.

In the above modification, the conductive film 283 is formed on the entire exterior surface of the housings 281 and 282. However, for example, the conductive film may be formed only on the entire exterior surface of the part of the increased-diameter part 4*b* constituting the shorter part 4*c*. That is, the conductive film needs to be formed only on a part that contacts or be in the vicinity of the measuring plate 18*a* or the insulative glass. In this case, as in the above modification, the charges occurring to the increased-diameter part 4*b* and on the interior surface of the shorter part 4*c* are canceled. Therefore, the similar effects are achieved. Note that the charge on the interior surface of the lengthy part 4*a*, which is caused by triboelectric charging, is relatively apart from the measuring plate 18*a*. Therefore, an influence of this charge to the measurement of the weight is very unlikely.

Further, in the above described embodiment and the modification, the electric charge of the fine particles sucked in the filter cartridge 4 or 204 is measured, while the filter cartridge 4 or 204 is electrically connected to the first and second inner covers 23 and 53 of the Faraday cage 1. However, the electric charge of the fine particles may be measured after electrically insulating the filter cartridge 4 and 204 from the first and second inner covers 23 and 53. In this case, charges occur on the exterior surface of the filter cartridge 4 or 204 and the interior surfaces of the first and second inner covers 23 and 53. The charge occurred on the exterior surface of the filter cartridges 4 or 204 and the charge occurred on the interior surfaces of the first and second inner covers 23 and 53 are due to electrostatic induction caused by the charges E2, E5*b*, and E6*b*. The charge on the exterior surface of the filter cartridge 4 or 204 is discharged from the filter cartridge 4 or 204, before the measurement of the weight, through the user and the air while the user holds the filter cartridge 4 or 204. The charge is also discharged from the filter cartridge 4 or 204 through the measuring plate 18*a*. Therefore, highly accurate measurement of the weight of the filter cartridge 4 or 204 by the electronic balance 9 is possible, as is the case described hereinabove.

Note that the filter cartridge is not limited to one made of a synthetic resin to which a conductivity is realized, and may be one made of an insulative material such as glass fiber, fabric, paper, or trees to which conductivity is realized. Further, the above embodiment provided an explanation on a filter cartridge which is attached to a Faraday cage for measuring the electric charge of fine particles sucked in from the outside, and which has a filter for collecting the fine particles sucked in. The filter cartridge may be, for example, a saclike meshed container made of synthetic resin, glass fiber, fabric, paper, or wood to which conductivity is realized by, for example, spraying a conductive material.

Thus, a preferable embodiment of the present invention is described hereinabove. It should be noted that the present invention is not limited to the above embodiment, and may be altered in various ways within the scope of claims. For example, the above embodiment and modification deal with a case where the container of the filter cartridge has the lengthy part, the increased-diameter part, and the shorter part. However, the filter cartridge may be a cylinder whose shape relative to the suction direction is the same, or rectangular or polyangular tube. Further, the outer shield line of the coaxial cable 13 may be connected to the first outer cover 21, and the core line to the first inner cover 23. It is possible to adopt a wiring member other than the coaxial cable 13.

Further, the above described embodiment deals with a case where the lock mechanism is constituted by the projections 51*a* and 51*b* and the annular projection 33. It is however possible to form a male thread on the outer circumferential surface of the cover 21 and a female thread part on the inner circumferential surface of the cover 51. This way, the both housings are engaged with each other by rotating one of the housings in a circumferential direction so that the male thread is screwed into the female thread. Further, the projections 51*a* and 51*b* may be formed on the first housing 2, and the annular projection 33 may be formed on the second housing 3. In other words, the arrangement of the projections 51*a* and 51*b* and the arrangement of the annular projection 33, on the housings 2 and 3 may be other way around.

Further, the lock mechanism is not limited to the one described above, as long as the first and second housings 2 and 3 are coupled with or separated from each other reliably and easily. For example, the lock mechanism may be a hook or a coupler which engages with the groove 32, simply by fitting the first housing 2 to the second housing 3, so that the both housings 2 and 3 are not separated. Further, the lock mechanism may be a plunger type lock mechanism such that the both housings 2 and 3 are locked and not separable, simply by the press-fit plungers 39*a* and 39*b*.

Further, in the above embodiment, the downstream end of the filter cartridge 4 is pressed against a side surface of the second holder 52 to prevent the fine particles from being sucked in, from between the leading end portion 41*a* of the first inner cover 23 and the leading end portion 86 of the filter cartridge 4, into a gap between the first inner cover 23 and the filter cartridge 4. This prevention is made further reliable by forming the leading end portion of the first inner cover 23 in a shape as shown in FIG. 14(*a*).

Figure 14:
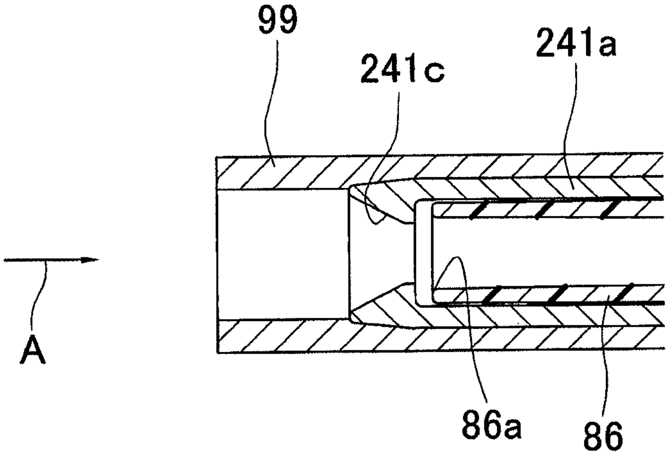
FIG. 14 includes (a) which is a cross sectional view showing a main part of the modification of the leading end portion of the first inner cover, and (b) which is a cross sectional view showing a main part of the modification of a portion at which the first inner cover and the second inner cover contact each other.
Figure 14:
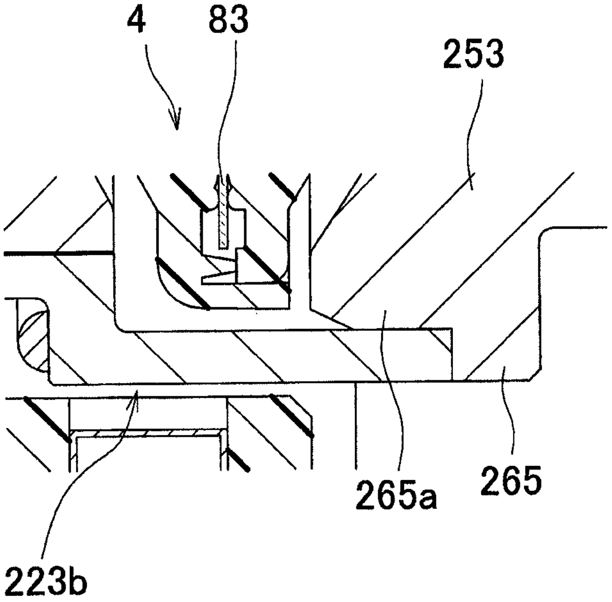

As shown in FIG. 14(*a*), the inner diameter of the suction port 241*c* of the leading end portion 241*a* is gradually reduced from the upstream end towards the downstream end. The inner diameter at the downstream end is made smaller than that of the suction port 86*a* of the filter cartridge 4. This structure more reliably prevents adhesion of the fine particles to the outer circumference of the suction port 86*a* of the filter cartridge 4.

Further, in the above embodiment, the downstream end surface of the first inner cover 23 and the upstream end surface of the annular projection 65 of the second inner cover 53 are brought into contact with each other, to electrically contact the first inner cover 23 and the second inner cover 53. This electric contact is made more reliable by having the downstream end of the first inner cover and the upstream end of the second inner cover contact each other as shown in FIG. 14(*b*).

As shown in FIG. 14(*b*), a projecting stair-like part 265*a* in the shape of ring is formed on the upstream end surface of the annular projection 265 of the second inner cover 253 which surface contacts the downstream end surface of the increased-diameter part 223*b* of the first inner cover. This projecting stair-like part 265*a* has an outer diameter that matches with the inner diameter of the increased-diameter part 223*b*. In this case, when the first inner cover and the second inner cover are brought into contact with each other, the downstream end surface of the increased-diameter part 223*b* and the upstream end surface of the annular projection 265 contact each other, and the outer circumferential side surface of the projecting stair-like part 265*a* and the inner circumferential surface of the increased-diameter part 223*b* contact each other. Thus, even if contamination occurs between the downstream end surface of the increased-diameter part 223*b* and the upstream end surface of the annular projection 265, the contact of the projecting stair-like part 265*a* to the inner circumferential surface of the increased-diameter part 223*b* is ensured. This way the reliability of the electric contact is further improved.

Further, the filter unit may be provided in the casing 1*a*. In this case, the filter unit may be provided on the air outputting route which is downstream from the outlet port 98 of the filter cartridge 4. Further, the filter unit 5 may have a partially transparent or non-transparent main body part, instead of the main body part 7*a*. Further, the filter member 8 in the filter unit 5 is not particularly limited as long as the filtration accuracy thereof is at least equal to that of the filter 83.

Further, the biasing members 47 and 49 may be omitted. Further, a plurality of projections 89 does not have to be formed on the outer circumferential surface of the filter cartridge 4. Further, the upstream end of the first inner cover 23 and the upstream end of the filter cartridge 4 relative to the suction direction A do not necessarily have to be coincided with each other. Further, the outer circumferential side surface of the filter cartridge 4 does not have to be chamfered. Further, the ribs 93 do not have to be formed on the housing 82.

Further, in the above embodiment, the lengthy part 4*a* has the degression area 84*a* and the progressive area 84*b*. These two areas 84*a* and 84*b* however are not necessary. That is, the lengthy part 4*a* may have a single progressive area (degression area) in which the inner diameter gradually increases (decreases) in the suction direction A, or a straight area where the inner diameter is constant. Note that the shorter part 4*c* may also have a degression area in which the inner diameter gradually decreases in the suction direction A, or a straight area where the inner diameter is constant. Further, the diameter of the suction port 86*a* may be larger than or equal to that of the outlet port 98. Further, the annular projection 95 may be formed on the downstream end of the shorter part 4*c*.

REFERENCE NUMERALS

1 Faraday Cage
1*a* Casing
2 First Housing
3 Second Housing
4, 204 Filter Cartridge
4*a* Lengthy Part (First Cylindrical Part)
4*b* Increased-Diameter Part
4*c* Shorter Part (Second Cylindrical Part)
5 Filter Unit
7 Resin Case
8 Filter Member (Second Filter)
10, 15 Hard Coating
11, 16 Contact Area
14 Electric Potential Meter
18 Electronic Balance (Weight Gauge)
21 First Outer Cover
23 First Inner Cover
33 Annular Projection
34*a*, 34*b* Notch
47 Biasing Member (Second Biasing Member)
49 Biasing Member (First Biasing Member)
51 Second Outer Cover
51*a*, 51*b* Projection
53 Second Inner Cover
81, 82, 281, 282 Housing (Container)
83 Filter (First Filter)
84*a* Degression Area
84*b*, 84*c* Progressive Area
86*a* Suction Port
89 Projection
95 Annular Projection

98 Outlet Port
100 Device
283 Conductive Film

The invention claimed is:

1. A Faraday cage, comprising:
a casing structured by:
a first housing comprising:
a first outer cover made of a conductive material, and
a first inner cover made of a conductive material, which is accommodated in the first outer cover and is electrically insulated from the first outer cover, and
a second housing comprising:
a second outer cover made of a conductive material, which fits the first outer cover, and
a second inner cover made of a conductive material, which is accommodated in the second outer cover and is electrically insulated from the second outer cover,
wherein the first and second housings are separable from each other;
wherein a disposable filter cartridge exchangeably disposed inside the casing accommodates therein a first filter for collecting fine particles sucked in from the outside the casing;
wherein the filter cartridge is made of a synthetic resin, and comprises:
a first cylindrical part extended in a direction of sucking in fine particles,
an increased-diameter part accommodating therein the first filter, whose diameter is larger than that of the first cylindrical part, and
a second cylindrical part extended in the suction direction, which is disposed in such a manner that the increased-diameter part is interposed between the second cylindrical part and the first cylindrical part in the suction direction; and
wherein the first cylindrical part, the increased-diameter part, and the second cylindrical part are undetachably connected with each other to have an integral structure.

2. The Faraday cage according to claim 1,
wherein the first and second housings have a lock mechanism which, by fitting the first and second outer covers together, enables the first and second housings to be engaged with each other, while keeping the respective end surfaces of the first and second inner covers pressed against each other relative to a fitting direction.

3. The Faraday cage according to claim 2,
wherein the lock mechanism comprises:
a projection projecting in the fitting direction, from a portion of an inner circumferential surface of one of the first and second outer covers facing another one of the first and second outer covers, and
an annular projection projecting from a portion of an outer circumferential surface of the other one of the first and second outer covers facing the one of the first and second outer covers, the annular projection having a notch which corresponds to the projection; and
wherein the projection engages with the annular projection by rotating one of the housings less than once in a circumferential direction, after the first and second outer covers are fit together in such a manner that the projection passes the notch.

4. The Faraday cage according to claim 1, further comprising a first biasing member disposed between the first outer cover and the first inner cover, which biases the first inner cover away from the first outer cover along the fitting direction.

5. The Faraday cage according to claim 1, further comprising a second biasing member disposed between the first inner cover and the filter cartridge, which biases away from the first inner cover in the fitting direction.

6. The Faraday cage according to claim 1,
wherein the first and second outer covers have a hard coating on their respective fitting areas; and
wherein the hard coating is harder than a base material of the covers.

7. The Faraday cage according to claim 6,
wherein the hard coating is insulative; and
wherein the hard coating is not formed on respective contact areas of the first and second outer covers, the contact areas being respective portions of the fitting areas, which contact each other when the first and second outer covers are coupled with each other.

8. The Faraday cage according to claim 7, wherein the hard coating is formed on the entire surfaces of the first and second outer covers, except for the contact areas.

9. The Faraday cage according to claim 6,
wherein the first and second outer covers are made of aluminum or an alloy containing aluminum; and
wherein the hard coating is formed by anodizing.

10. The Faraday cage according to claim 6, wherein the hard coating is conductive.

11. The Faraday cage according to claim 1,
wherein a light-transmissive area is formed at least one of the first cylindrical part, the increased-diameter part, and the second cylindrical part.

12. The Faraday cage according to claim 11, wherein the light-transmissive area is formed upstream of the first filter of the increased-diameter part, relative to the suction direction.

13. The Faraday cage according to claim 11, wherein the filter cartridge is made of a semi-transparent or transparent synthetic resin, and the light-transmissive area is formed on the entire filter cartridge.

14. The Faraday cage according to claim 1,
wherein the first cylindrical part is disposed upstream of the increased-diameter part relative to the suction direction, and has a length which is longer than the diameter of the increased-diameter part and longer than the second cylindrical part; and
wherein the first cylindrical part has a degression area in which the inner diameter of the first cylindrical part gradually decreases in the suction direction, and a progressive area formed at the downstream of the degression area, in which the inner diameter gradually increases in the suction direction.

15. The Faraday cage according to claim 1,
wherein the second cylindrical part has a progressive area in which the inner diameter of the second cylindrical part gradually increases in the suction direction; and
wherein an outlet port at the most downstream of the second cylindrical part has a larger diameter than that of a suction port at the most upstream of the first cylindrical part.

16. The Faraday cage according to claim 1, wherein the second cylindrical part has, at its downstream end portion relative to the suction direction, an annular projection projecting from the outer circumferential surface of the second cylindrical part.

17. The Faraday cage according to claim 1, wherein an outer circumferential side surface of the increased-diameter part is chamfered to form a polygonal shape.

18. The Faraday cage according to claim 1, wherein the filter cartridge includes a container made of a synthetic resin; and the container is made conductive.

19. The Faraday cage according to claim 18, wherein the synthetic resin contains a conductive material.

20. The Faraday cage according to claim 18, wherein the container has a conductive film which is formed on at least a part of its exterior surface.

21. The Faraday cage according to claim 20, wherein the container has a conductive film throughout its entire exterior surface.

22. The Faraday cage according to claim 1, wherein the outer circumferential surface of the filter cartridge has thereon a plurality of projections which are disposed apart from one another along the circumferential direction; and wherein the plurality of projections each has a leading end which engages with the first inner cover, when the filter cartridge is inserted into the first inner cover.

23. The Faraday cage according to claim 1, wherein the upstream end of the first inner cover and the upstream end of the filter cartridge are disposed at substantially the same position relative to the suction direction of sucking in fine particles.

24. The Faraday cage according to claim 1, further comprising a filter unit which is provided in a midway portion of a route downstream from the filter cartridge, and which includes a second filter whose filtration accuracy is equal to or higher than that of the first filter.

25. The Faraday cage according to claim 24, wherein the filter unit is provided outside the casing.

26. The Faraday cage according to claim 25, wherein the filter unit has a resin case for accommodating the second filter; and wherein the resin case has a light-transmissive area in its portion to face the second filter.

27. The Faraday cage according to claim 24, wherein the filtration accuracy of the second filter is higher than that of the first filter.

28. A device, comprising:

a Faraday cage according to claim 1;

an electric potential meter connected to wiring which is connected to one of the first and second outer covers and one of the first and second inner covers; and a weight gauge capable of measuring the weight of the filter cartridge.

* * * * *